(12) United States Patent
Yuasa et al.

(10) Patent No.: US 8,822,350 B2
(45) Date of Patent: Sep. 2, 2014

(54) METHOD OF MANUFACTURING SEMICONDUCTOR DEVICE, SUBSTRATE PROCESSING METHOD AND SUBSTRATE PROCESSING APPARATUS

(75) Inventors: Kazuhiro Yuasa, Takaoka (JP); Ryuji Yamamoto, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/988,441

(22) PCT Filed: Nov. 8, 2011

(86) PCT No.: PCT/JP2011/075704
§ 371 (c)(1),
(2), (4) Date: Jun. 28, 2013

(87) PCT Pub. No.: WO2012/066977
PCT Pub. Date: May 24, 2012

(65) Prior Publication Data
US 2013/0280919 A1    Oct. 24, 2013

(30) Foreign Application Priority Data

Nov. 19, 2010 (JP) ................................. 2010-258903

(51) Int. Cl.
*H01L 21/316* (2006.01)
*H01L 21/8242* (2006.01)
*H01L 21/31* (2006.01)
*H01L 27/108* (2006.01)
*C23C 16/40* (2006.01)
*H01L 21/02* (2006.01)
*C23C 16/452* (2006.01)
*C23C 16/455* (2006.01)

(52) U.S. Cl.
CPC .... *H01L 21/02263* (2013.01); *H01L 21/02189* (2013.01); *H01L 21/02175* (2013.01); *C23C 16/452* (2013.01); *C23C 16/45546* (2013.01); *C23C 16/45534* (2013.01); *C23C 16/40* (2013.01); *H01L 21/02186* (2013.01); *H01L 21/02183* (2013.01); *H01L 21/02164* (2013.01); *H01L 21/02181* (2013.01); *H01L 21/0228* (2013.01)
USPC ........... 438/778; 438/584; 438/591; 438/648; 438/684; 438/685; 438/62; 438/681; 438/585; 438/758; 438/765; 438/760; 438/784; 438/785; 438/787; 438/789; 438/790

(58) Field of Classification Search
USPC ........... 438/778, 62, 681, 685, 584, 648, 585, 438/758, 765, 760, 770, 784, 591, 785, 787, 438/789, 790; 257/E21.18
See application file for complete search history.

(56) References Cited

U.S. PATENT DOCUMENTS

| | | | | |
|---|---|---|---|---|
| 5,441,594 A | * | 8/1995 | Zenke | 438/396 |
| 6,884,738 B2 | * | 4/2005 | Asai et al. | 438/758 |
| 7,141,492 B2 | * | 11/2006 | Yudasaka | 438/497 |
| 7,648,578 B1 | * | 1/2010 | Itatani et al. | 118/715 |
| 7,682,987 B2 | * | 3/2010 | Yuasa et al. | 438/765 |
| 8,039,404 B2 | * | 10/2011 | Miya et al. | 438/786 |
| 8,076,251 B2 | * | 12/2011 | Akae et al. | 438/786 |
| 8,105,957 B2 | * | 1/2012 | Miya et al. | 438/765 |
| 8,123,858 B2 | * | 2/2012 | Wang et al. | 117/89 |
| 8,227,346 B2 | * | 7/2012 | Miya et al. | 438/680 |
| 8,278,224 B1 | * | 10/2012 | Mui et al. | 438/778 |
| 2001/0046792 A1 | | 11/2001 | Takahashi et al. | |
| 2004/0168638 A1 | | 9/2004 | Ishii et al. | |
| 2006/0032442 A1 | | 2/2006 | Hasebe | |
| 2007/0026654 A1 | | 2/2007 | Huotari et al. | |
| 2007/0087492 A1 | * | 4/2007 | Yamanaka | 438/166 |
| 2007/0259110 A1 | | 11/2007 | Mahajani et al. | |
| 2008/0119033 A1 | | 5/2008 | Ashigaki et al. | |
| 2010/0105192 A1 | | 4/2010 | Akae et al. | |
| 2010/0117203 A1 | * | 5/2010 | Bailey et al. | 257/627 |

FOREIGN PATENT DOCUMENTS

| JP | A-2001-345321 | 12/2001 |
| JP | A-2002-334867 | 11/2002 |
| JP | A-2006-54432 | 2/2006 |
| JP | A-2006-190787 | 7/2006 |
| JP | A-2006-257551 | 9/2006 |
| JP | A-2008-131050 | 6/2008 |
| JP | A-2009-49316 | 3/2009 |
| JP | A-2009-536267 | 10/2009 |
| JP | A-2010-153776 | 7/2010 |
| JP | A-2010-219561 | 9/2010 |

* cited by examiner

OTHER PUBLICATIONS

International Search Report issued in International Patent Application No. PCT/JP2011/075704 dated Jan. 17, 2012.

*Primary Examiner* — Evan Pert
*Assistant Examiner* — Gustavo Ramallo

(74) *Attorney, Agent, or Firm* — Oliff PLC

(57) ABSTRACT

An oxide film is formed, having a specific film thickness on a substrate by alternately repeating: forming a specific element-containing layer on the substrate by supplying a source gas containing a specific element, to the substrate housed in a processing chamber and heated to a first temperature; and changing the specific element-containing layer formed on the substrate, to an oxide layer by supplying a reactive species containing oxygen to the substrate heated to the first temperature in the processing chamber under a pressure of less than atmospheric pressure, the reactive species being generated by causing a reaction between an oxygen-containing gas and a hydrogen-containing gas in a pre-reaction chamber under a pressure of less than atmospheric pressure and heated to a second temperature higher than the first temperature.

15 Claims, 8 Drawing Sheets

METHOD OF MANUFACTURING SEMICONDUCTOR DEVICE, SUBSTRATE PROCESSING METHOD AND SUBSTRATE PROCESSING APPARATUS

TECHNICAL FIELD

The present invention relates to a method of manufacturing a semiconductor device, a substrate processing method including forming a thin film on a substrate, and a substrate processing apparatus.

DESCRIPTION OF RELATED ART

A manufacturing step of a semiconductor device includes forming a high dielectric insulating film (High-k film) having a larger dielectric constant than the dielectric constant of a silicon oxide film ($SiO_2$ film) on a wafer such as a silicon wafer, etc. The high dielectric insulating film can be formed, for example by an ALD method and a cyclic CVD method, by supplying a source and an oxidizing agent required for forming the film, to the wafer and exhausting them alternately. An ozone ($O_3$) gas having a strong oxidizability in a low temperature zone and an oxygen ($O_2$) gas excited by plasma, have been used as oxidizing agents (for example, see patent document 1).

PRIOR ART DOCUMENT

Patent Document

Patent Document 1:
Japanese Patent Laid Open Publication No. 2009-49316

SUMMARY OF THE INVENTION

Problem to be Solved by the Invention

However, from the request for improving productivity, an oxidation time is a subject, which is the time required for oxidation using the oxidizing agent and controlling a film forming rate during film formation. Therefore, the oxidizing agent having a stronger oxidizability is required in a low temperature zone. Then, the oxidizability by an $O_3$ gas and an $O_2$ gas excited by plasma, cannot be sufficient to satisfy the request for improving productivity.

Accordingly, an object of the present invention is to provide a method of manufacturing a semiconductor device, a substrate processing method and a substrate processing apparatus capable of shortening an oxidation time during film formation, and improving productivity.

Means for Solving the Problem

According to an aspect of the present invention, there is provided a method of manufacturing a semiconductor device, including:

forming an oxide film having a specific film thickness on a substrate by alternately repeating:

forming a specific element-containing layer on the substrate by supplying a source gas containing a specific element, to the substrate housed in a processing chamber and heated to a first temperature; and changing the specific element-containing layer formed on the substrate, to an oxide layer by supplying a reactive species containing oxygen to the substrate heated to the first temperature in the processing chamber under a pressure of less than atmospheric pressure, the reactive species being generated by causing a reaction between an oxygen-containing gas and a hydrogen-containing gas in a pre-reaction chamber under a pressure of less than atmospheric pressure and heated to a second temperature higher than the first temperature.

According to other aspect of the present invention, there is provided a substrate processing method, including:

forming an oxide film having a specific film thickness on a substrate by alternately repeating:

forming a specific element-containing layer on the substrate by supplying a source gas containing a specific element, to the substrate housed in a processing chamber and heated to a first temperature; and changing the specific element-containing layer formed on the substrate, to an oxide layer by supplying a reactive species containing oxygen to the substrate heated to the first temperature in the processing chamber under a pressure of less than atmospheric pressure, the reactive species being generated by causing a reaction between an oxygen-containing gas and a hydrogen-containing gas in a pre-reaction chamber under a pressure of less than atmospheric pressure and heated to a second temperature higher than the first temperature.

According to further other aspect of the present invention, there is provided a substrate processing apparatus, including:

a processing chamber configured to house a substrate and process the substrate;

a first heating source configured to heat the substrate to a first temperature in the processing chamber;

a pre-reaction chamber configured to cause a reaction among a plurality of kinds of gases;

a second heating source configured to heat an inside of the pre-reaction chamber to a second temperature;

a source gas supply system configured to supply a source gas containing a specific element into the processing chamber;

an oxygen-containing gas supply system configured to supply an oxygen-containing gas into the pre-reaction chamber;

a hydrogen-containing gas supply system configured to supply a hydrogen-containing gas into the pre-reaction chamber;

a piping part configured to connect the pre-reaction chamber and the processing chamber;

a pressure adjustment part configured to adjust pressures in the processing chamber and the pre-reaction chamber; and a control part configured to control the first heating source, the second heating source, the source gas supply system, the oxygen-containing gas supply system, the hydrogen-containing gas supply system, and the pressure adjustment part, so that an oxide film having a specific film thickness is formed on the substrate, by alternately repeating a process of forming a specific element-containing layer on the substrate by supplying the source gas to the substrate housed in the processing chamber and heated to the first temperature; and a process of changing the specific element-containing layer formed on the substrate, to an oxide layer by supplying a reactive species containing oxygen to the substrate heated to the first temperature in the processing chamber under a pressure of less than atmospheric pressure, the reactive species being generated by causing a reaction between an oxygen-containing gas and a hydrogen-containing gas in the pre-reaction chamber under a pressure of less than atmospheric pressure and heated to the second temperature higher than the first temperature.

Advantage of the Invention

According to the present invention, there is provided a method of manufacturing a semiconductor device, a substrate processing method and a substrate processing apparatus, capable of shortening an oxidation time in film formation and improving productivity.

DETAILED DESCRIPTION OF THE INVENTION

Embodiments of the present invention will be described hereafter based on the drawings.

Figure 1:
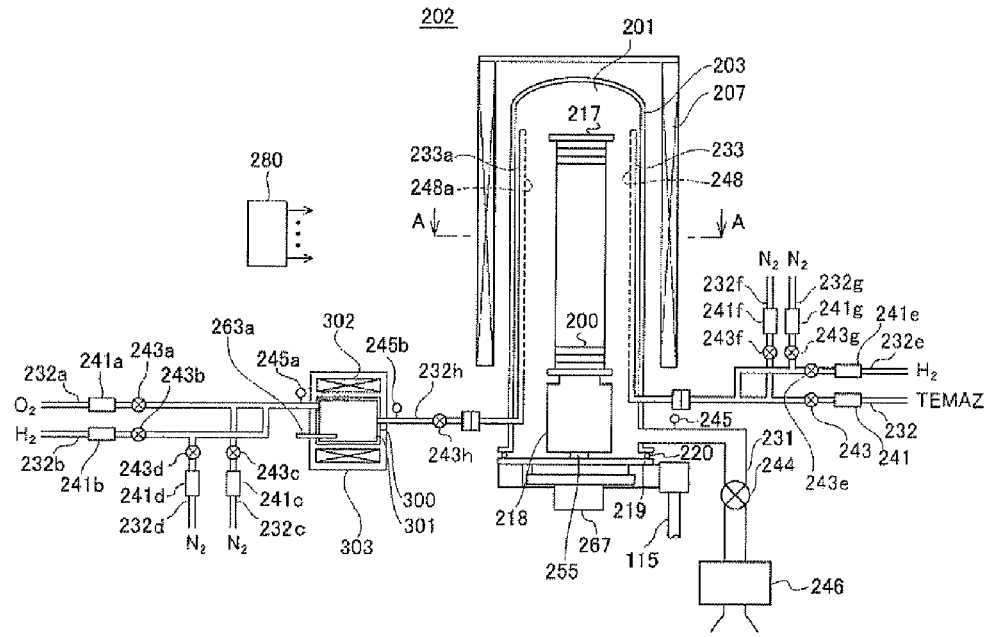
FIG. 1 is a schematic block diagram of a vertical processing furnace of a substrate processing apparatus suitably used in this embodiment, and is a view showing a processing furnace portion in a vertical cross-sectional view.
Figure 2:
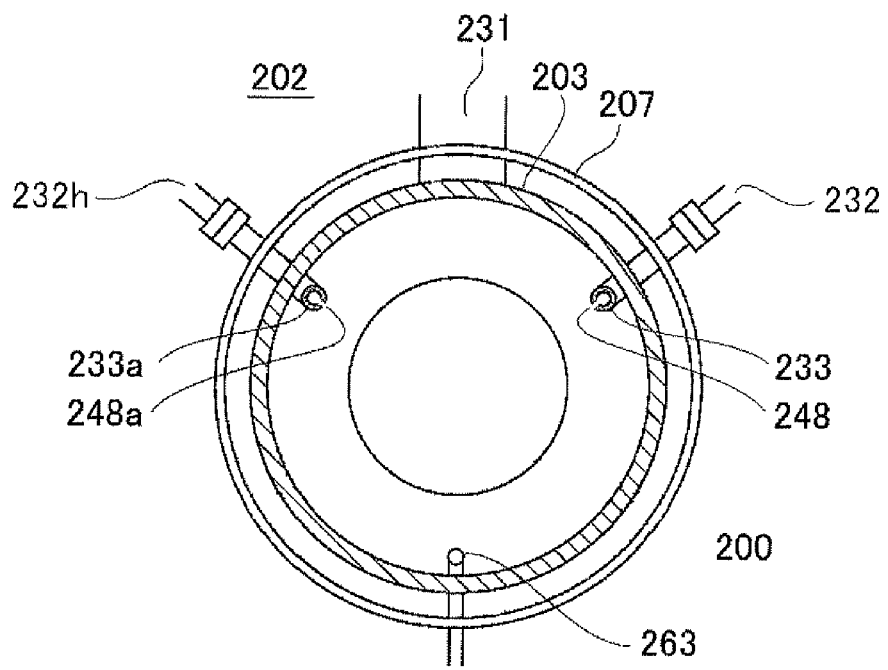
FIG. 2 is a schematic block diagram of the vertical processing furnace of the substrate processing apparatus suitably used in this embodiment, and is a view showing the processing furnace portion taken along the line A-A of FIG.

FIG. 1 is a schematic block diagram of a vertical processing furnace of a substrate processing apparatus suitably used in this embodiment, and shows a processing furnace 202 portion in a vertical cross-sectional view. Further, FIG. 2 is a schematic block diagram of the vertical processing furnace of the substrate processing apparatus suitably used in this embodiment, and is a view showing the processing furnace 202 portion taken along the line A-A of FIG. 1. Note that the present invention is suitably applied not only to the substrate processing apparatus of this embodiment, but also to a substrate processing apparatus having a single wafer type, Hot Wall type, Cold Wall type processing furnaces.

As shown in FIG. 1, the processing furnace 202 has a first heater 207 as a first heating source (first heating unit). The first heater 207 has a cylindrical shape, and is vertically installed on a heater base (not shown) as a holding plate by being supported thereby. The first heater 207 is a resistance heating type heater (a heat source by resistance heating), and is configured to heat a wafer 200 in a processing chamber 201 described later, to a first temperature.

A process tube 203 as a reaction tube is disposed inside of the first heater 207 concentrically with the first heater 207. The process tube 203 is made of a heat-resistant material such as quartz ($SiO_2$) or silicon carbide (SiC), etc., for example, and is formed into a cylindrical shape, with an upper end closed and a lower end opened. A processing chamber (reaction chamber) 201 is formed in a cylinder hollow part of the process tube 203, so that wafers 200 being substrates, can be stored by a boat 217 described later in a state of being vertically arranged in multiple stages in a horizontal posture. A reaction vessel (processing vessel) is formed by the process tube 203.

A first nozzle 233 as a first gas introducing part, and a second nozzle 233a as a second gas introducing part, are provided in the process tube 203 so as to pass through a side wall of a lower part of the process tube 203. The first nozzle 233 and the second nozzle 233a are provided in an arc-shaped space between an inner wall of the process tube 203 constituting the processing chamber 201 and the wafers 200, extending from a lower part to an upper part of the inner wall of the process tube 203, so as to rise toward an upper part of a stacking direction of the wafers 200. Namely, the first nozzle 233 and the second nozzle 233a are respectively provided at side parts of a wafer arrangement region in which the wafers 200 are arranged. The first nozzle 233 and the second nozzle 233a are formed as L-shaped long nozzles. Gas supply holes 248, 248a for supplying gases, are provided on side faces of the first nozzle 233 and the second nozzle 233a. Each gas supply hole 248, 248a is opened to face a center of the reaction tube 203, so that the gas can be supplied toward the wafers 200. These gas supply holes 248, 248a are provided extending from a lower part to an upper part of the process tube 203, each of them having the same opening area and provided at the same opening pitch. A source gas supply tube 232 is connected to the first nozzle 233, and a reaction gas supply tube 232h is connected to the second nozzle 233a. A metal manifold for supporting the process tube 203 is provided in a lower part of the process tube 203, and the first nozzle 233 and the second nozzle 233a may be provided so as to pass through a side wall of the metal manifold. In this case, an exhaust tube 231 described later may be further provided in this metal manifold. In this case as well, the exhaust tube 231 may be provided not in the metal manifold, but in the lower part of the process tube 203. Thus, a furnace throat part of the processing furnace is made of metal, and a nozzle, etc., may be attached to the metal furnace throat part.

A mass flow controller (MFC) 241 being a flow rate control unit (flow rate control part), and a valve 243 being an open/close valve are provided on the source gas supply tube 232 sequentially from an upstream direction. Further, a first inert gas supply tube 232f is connected to a downstream side of the valve 243 of the source gas supply tube 232. A mass flow controller 241f being a flow rate control unit (flow rate control part), and a valve 243 being an open/close valve, are provided on the first inert gas supply tube 232f sequentially from the upstream direction. The above-mentioned first nozzle 233 is connected to a tip part of the source gas supply tube 232. A source gas supply system is mainly constituted of the source gas supply tube 232, the mass flow controller 241, and the valve 243. The first nozzle 233 may be included in a source gas supply system. Also, a first inert gas supply system is mainly constituted of the first inert gas supply tube 232f, the mass flow controller 241f, and the valve 243f. The first inert gas supply system also functions as a purge gas supply system.

A hydrogen-containing gas supply tube 232e is connected to a downstream side of a connection part connected to the first inert gas supply tube 232f of the source gas supply tube 232. A mass flow controller 241e, being a flow rate control unit (flow rate control part) and a valve 243e being an open/close valve, are provided on the hydrogen-containing gas supply tube 232e sequentially from the upstream direction. Also, a second inert gas supply tube 232g for supplying an inert gas, is connected to a downstream side of the valve 243e of the hydrogen-containing gas supply tube 232e. A mass flow controller 241g being a flow rate control unit (flow rate control part) and a valve 243g being an open/close valve, are provided on the second inert gas supply tube 232g sequentially from the upstream direction. A hydrogen-containing gas supply system is mainly constituted of the hydrogen-containing gas supply tube 232e, the mass flow controller 241e, and the valve 243e. Also, a second inert gas supply system is mainly constituted of the second inert gas supply tube 232g, the mass flow controller 241g, and the valve 243g. The second inert gas supply system also functions as the purge gas supply system.

As a source gas containing a specific element, namely, as the source gas (zirconium source gas) containing zirconium (Zr) being a metal element as a specific element, for example, tetrakis ethyl methyl amino zirconium ($Zr[N(C_2H_5)(CH_3)]_4$, abbreviated as TEMAZ) gas is supplied into the processing chamber 201 from the source gas supply tube 232 through the mass flow controller 241, the valve 243, and the first nozzle 233. Namely, the source gas supply system is configured as a zirconium source gas supply system. Simultaneously at this time, the inert gas may also be supplied into the source gas supply tube 232 from the inert gas supply tube 232f through the mass flow controller 241f and the valve 243f. The inert gas supplied into the source gas supply tube 232, is supplied into the processing chamber 201 together with the TEMAZ gas through the first nozzle 233. When using a liquid source in a liquid state under normal temperature and pressure like TEMAZ, the liquid source is vaporized by a vaporizer or a vaporizing system such as a bubbler, and is supplied as the source gas.

For example, a hydrogen-containing gas, namely, a hydrogen ($H_2$) gas for example, is supplied into the processing chamber 201 from the hydrogen-containing gas supply tube 232e, through the mass flow controller 241e, the valve 243e, and the first nozzle 233. Namely, the hydrogen-containing gas supply system is configured as a reducing gas supply system. Simultaneously at this time, the inert gas may be supplied into the hydrogen-containing gas supply tube 232e from the second inert gas supply tube 232g, through the mass flow controller 241g and the valve 243g.

A valve 243h being an open/close valve is provided on the reaction gas supply tube 232h. A pre-reaction vessel 300 constituting a pre-reaction chamber 301 described later, is connected to an upstream side of the reaction gas supply tube 232h. A pressure sensor 245b as a pressure detection unit (pressure detection part) for detecting a pressure inside of the pre-reaction chamber 301, namely, the pressure at a secondary side (downstream side) of the pre-reaction chamber 301, is provided near the pre-reaction chamber 301 of the reaction gas supply tube 232h. A reaction gas supply system is mainly constituted of the reaction gas supply tube 232h and the valve 243h. Also, a piping part (communication part) as a connection part for connecting the pre-reaction chamber 301 and the processing chamber 201 and communicating both chambers, is constituted of the reaction gas supply tube 232h and the second nozzle 233a, and by this piping part, a flow passage is formed for flowing a gas into the processing chamber 201 from the inside of the pre-reaction chamber 301.

The oxygen-containing gas supply tube 232a and the hydrogen-containing gas supply tube 232b are further connected to the pre-reaction vessel 300. Specifically, a joint piping part where the oxygen-containing gas supply tube 232a and the hydrogen-containing gas supply tube 232b are joined, is connected to the pre-reaction vessel 300, so that the oxygen-containing gas and the hydrogen-containing gas can be supplied into the pre-reaction chamber 301 from the oxygen-containing gas supply tube 232a and the hydrogen-containing gas supply tube 232b, through the joint piping part.

A mass flow controller 241a being a flow rate control unit (flow rate control part), and a valve 243a being an open/close valve, are provided on the oxygen-containing gas supply tube 232a, sequentially from the upstream direction. Further, a third inert gas supply tube 232c for supplying an inert gas, is connected to the downstream side of the valve 243a of the oxygen-containing gas supply tube 232a. A mass flow controller 241c being a flow rate control unit (flow rate control part) and a valve 243c being an open/close valve, are provided on the third inert gas supply tube 232c sequentially from the upstream direction. The pre-reaction chamber 301 is connected to the tip part (downstream end part) of the oxygen-containing gas supply tube 232a through the joint piping part. An oxygen-containing gas supply system is mainly constituted of the oxygen-containing gas supply tube 232a, the mass flow controller 241a, and the valve 243a. Also, a third inert gas supply system is mainly constituted of the third inert gas supply tube 232c, the mass flow controller 241c, and the valve 243c. The third inert gas supply system also functions as the purge gas supply system.

A mass flow controller 241b being a flow rate control unit (flow rate control part) and a valve 243b being an open/close valve are provided on the hydrogen-containing gas supply tube 232b sequentially from the upstream side. Further, a fourth inert gas supply tube 232d for supplying the inert gas, is connected to the downstream side of the valve 243b of the hydrogen-containing gas supply tube 232b. A mass flow controller 241d being a flow rate control unit (flow rate control part) and a valve 243d being an open/close valve, are provided on the fourth inert gas supply tube 232d sequentially from the upstream direction. The pre-reaction chamber 301 is connected to the tip part (downstream part) of the hydrogen-containing gas supply tube 232b through the joint piping part. A hydrogen-containing gas supply system is mainly constituted of the hydrogen-containing gas supply tube 232b, the mass flow controller 241b, and the valve 243b. Also, a fourth inert gas supply system is mainly constituted of the fourth inert gas supply tube 232d, the mass flow controller 241d, and the valve 243d. The fourth inert gas supply system also functions as the purge gas supply system.

For example, as an oxygen-containing gas, namely, an oxygen ($O_2$) gas for example as an oxidizing gas, is supplied into the pre-reaction chamber 301 from the oxygen-containing gas supply tube 232a, through the mass flow controller 241a and the valve 243a. Namely, the oxygen-containing gas supply system is configured as an oxidizing gas supply system. Simultaneously at this time, the inert gas may be supplied into the oxygen-containing gas supply tube 232a from the third inert gas supply tube 2323c through the mass flow controller 241c and the valve 243c.

For example, the hydrogen-containing gas, namely, the hydrogen ($H_2$) gas for example as the reducing gas, is supplied into the pre-reaction chamber 301 from the hydrogen-containing gas supply tube 232b, through the mass flow controller 241b and the valve 243b. Namely, the hydrogen-containing gas supply system is configured as the reducing gas supply system. Simultaneously at this time, the inert gas may also be supplied into the hydrogen-containing gas supply tube 232b from the fourth inert gas supply tube 232d, through the mass flow controller 241d and the valve 243d.

A pressure sensor 245a as a pressure detector (pressure detection part) for detecting the pressure inside of the pre-reaction chamber 301, namely, the pressure at a primary side (upstream side) of the pre-reaction chamber 301, is provided near the pre-reaction chamber 301 at the downstream side of the joint piping part where the oxygen-containing gas supply tube 232a and the hydrogen-containing gas supply tube 232b are joined.

The pre-reaction vessel 300 is made of a heat-resistant material such as quartz ($SiO_2$) or silicon carbide (SiC), etc., and is formed into a cylindrical shape. The pre-reaction chamber 301 is formed in a cylindrical hollow part of the pre-reaction vessel 300, and the pre-reaction chamber 301 is configured to cause a reaction between the oxygen-containing gas and the hydrogen-containing gas inside of the pre-reaction chamber thereof. One inlet and one outlet are provided in the pre-reaction vessel 300. The joint piping part where the oxygen-containing gas supply tube 232a and the hydrogen-containing gas supply tube 232b are joined, is connected to the inlet of the pre-reaction vessel 300, so that the oxygen-containing gas and the hydrogen-containing gas can be supplied into the pre-reaction chamber 301. The above-mentioned reaction gas supply tube 232h is connected to the outlet of the pre-reaction vessel 300, so that reactive species including oxygen such as atomic oxygen (O), etc., which is generated by causing the reaction between the oxygen-containing gas and the hydrogen-containing gas in the pre-reaction chamber 301, can be supplied into the reaction gas supply tube 232h. A second heater 302 as a second heating source (second heating unit) is provided around the pre-reaction vessel 300 so as to cover a cylindrical side face of the pre-reaction vessel 300. The second heater 302 has a cylindrical shape, and is provided concentrically with the pre-reaction vessel 300 which has also the cylindrical shape. The second heater 302 is a resistance heating type heater (a heat source by resistance heating), and is configured to heat the inside of the pre-reaction chamber 301 to a second temperature higher than the first temperature. The second heater 302 is configured so as to be controlled independently from the first heater 207. Further, a heat-insulating member 303 is provided around the second heater 302 and the pre-reaction vessel 300.

As described above, pressure sensors 245a, 245b are respectively provided near the joint piping part where the oxygen-containing gas supply tube 232a and the hydrogen-containing gas supply tube 232b are joined, and near the pre-reaction chamber 301 of the reaction gas supply tube 232h. As described above, the pressure sensor 245a is configured to detect the pressure at the primary side (upstream, side) of the pre-reaction chamber 301, namely, at an inlet side of the pre-reaction chamber 301, and the pressure sensor 245b is configured to detect the pressure at the secondary side (downstream side) of the pre-reaction chamber 301, namely, at an outlet side of the pre-reaction chamber 301. In at least an oxidizing step described later during the processing applied to the wafer 200, the pressure at the primary side of the pre-reaction chamber 301, and the pressure at the secondary side of the pre-reaction chamber 301, are monitored, to thereby monitor whether the pressure in the pre-reaction chamber 301 is maintained to a specific pressure of less than the atmospheric pressure. At this time, the pressure in the piping part between the pre-reaction chamber 301 and the processing chamber 201 is also monitored whether the pressure is maintained to a specific pressure.

In order to monitor whether the pressure in the pre-reaction chamber 301 and the pressure in the joint piping part are maintained to a specific pressure of less than the atmospheric pressure, the pressure at least at the secondary side of the pre-reaction chamber 301 may be monitored, and the pressure at the primary side may not be necessarily monitored. In this case, the pressure sensor 245a at the primary side of the pre-reaction chamber 301 may be omitted. However, by monitoring the pressure at the primary side of the pre-reaction chamber 301 and the pressure at the secondary side of the pre-reaction chamber 301, more reliable monitoring can be performed whether the pressure in the pre-reaction chamber 301 is maintained to a specific pressure of less than the atmospheric pressure, and a more suitable amount of reactive species can be generated, and safety is further improved.

An exhaust tube 231 for exhausting an atmosphere in the processing chamber 201, is provided in a lower part of the process tube 203. An exhaust port is formed at a connection part connecting the process tube 203 and the exhaust tube 231. A vacuum pump 246 being a vacuum exhaust device is connected to the exhaust tube 231, through a pressure sensor 245 being a pressure detector (pressure detection part) for detecting a pressure in the processing chamber 201, and an APC (Auto Pressure Controller) valve 244 being a pressure adjuster (pressure adjustment part). The APC valve 244 is configured to perform vacuum exhaust/stop of vacuum exhaust in the processing chamber 201 by opening and closing the valve in a state of operating the vacuum pump 246, and further is configured to adjust the pressure in the processing chamber 201 by adjusting an opening degree of the valve based on pressure information detected by the pressure sensor 245 in a state of operating the vacuum pump 246. With this structure, the inside of the processing chamber 201 can be vacuum-exhausted so as to be a specific pressure (vacuum degree) by adjusting an opening degree of the APC valve 244 based on the pressure information detected by the pressure sensor 245 while operating the vacuum pump 246. An exhaust system is mainly constituted of the exhaust tube 231, the pressure sensor 245, the APC valve 244, and the vacuum pump 246.

During processing applied to the wafer 200, the opening degree of the APC valve 244 is adjusted (controlled) based on the pressure information detected by the pressure sensor 245, so that the pressure in the processing chamber 201 is set to a specific pressure of less than the atmospheric pressure. At this time, the pressure in the pre-reaction chamber 301 is also adjusted to a specific pressure of less than the atmospheric pressure at least in the oxidizing step described later. Further, the pressure in the piping part between the pre-reaction chamber 301 and the processing chamber 201 is also adjusted to a specific pressure of less than the atmospheric pressure. At this time, as described above, the pressure at the primary side and the pressure at the secondary side of the pre-reaction chamber 301 are monitored by the pressure sensors 245a and 245b, to thereby monitor whether the pressure in the pre-reaction chamber 301 and the pressure in the piping part are maintained to a specific pressure of less than the atmospheric pressure.

Here, when the pressure in the pre-reaction chamber 301 is maintained to a specific pressure of less than the atmospheric pressure, namely, maintained to 3999 Pa or less, and preferably 2666 Pa or less, the $O_2$ gas and the $H_2$ gas are reacted with each other at a specific temperature, for example at 450° C. or more, to thereby generate the reactive species such as atomic oxygen (O), etc. Particularly, when the pressure in the pre-reaction chamber 301 is maintained to the pressure of 1333 Pa or less, the $O_2$ gas and the $H_2$ gas are properly reacted with each other at a specific temperature, at 450° C. or more for example, to thereby generate the reactive species such as a proper amount of the atomic oxygen (O), etc., without generating $H_2O$. A generation efficiency of the reactive species such as atomic oxygen (O), etc., is highest when the pressure in the pre-reaction chamber 301 is 1333 Pa or less, and a next high generation efficiency is in a case that the pressure in the pre-reaction chamber 301 is set to 2666 Pa or less, and the next high generation efficiency is in a case that the pressure in the pre-reaction chamber 301 is set to 3999 Pa or less. Namely, the pressure in the pre-reaction chamber 301 is set to 3999 Pa or less, preferably set to 2666 Pa or less, and more preferably set to 1333 Pa or less. Under these pressures, even when heat of 450° C. or more is added, a reaction probability between the $O_2$ gas and the $H_2$ gas is relatively low. Therefore, there is no supply of a heat of reaction which is required for achieving a chain reaction. Then, a pressure variation caused by a local volume swelling is absorbed, and $H_2/O_2$ ratio can be deviated from an explosion range of a mixed gas of the $O_2$ gas and the $H_2$ gas.

Reversely, when the pressure in the pre-reaction chamber 301 exceeds 3999 Pa, the reaction between the $O_2$ gas and the $H_2$ gas is excessively advanced when a heat of 450° C. or more for example is added, thus generating relatively a large amount of $H_2O$, and reducing a generation amount of the reactive species such as atomic oxygen (O), etc., and a reaction processing focusing on the reactive species, cannot be properly performed. Further, a risk of explosion is generated depending on the $H_2/O_2$ ratio under the above-mentioned temperature and pressure.

Therefore, in this embodiment, when the pressure in the pre-reaction chamber 301 is maintained to a specific pressure of less than the atmospheric pressure, namely, to the pressure of 3999 Pa (30 Torr) or less, the $H_2$ gas is allowed to be supplied into the pre-reaction chamber 301, and when the pressure in the pre-reaction chamber 301 is not maintained to the pressure of 3999 Pa or less, namely, when the pressure exceeds 3999 Pa, the $H_2$ gas is not allowed to be supplied into the pre-reaction chamber 301.

For example, in a case of a closed state of the valve 243b when the pressure the pre-reaction chamber 301 exceeds 3999 Pa, the valve 243b is set in a state unable to be opened, thus preventing the supply of the $H_2$ gas into the pre-reaction chamber 301. At this time, when the valve 243a is in a closed state, it is also acceptable that the valve 243a is set in a state unable to be opened, so that the $O_2$ gas is not allowed to be supplied into the pre-reaction chamber 301. Further, when the pressure in the pre-reaction chamber 301 exceeds 3999 Pa and the valve 243b is already in an open state, the valve 243b is set in a close state and the supply of the $H_2$ gas is stopped, to thereby stop the processing applied to the wafer 200. At this time, when the valve 243a is already in the open state, it is also acceptable that the valve 243a is set in the close state, so that the supply of the $O_2$ gas into the pre-reaction chamber 301 is stopped. However, in this case, the timing of stop of the supply of the $O_2$ gas needs to be properly adjusted by making the stop of the supply of the $O_2$ gas more delayed than the stop of the supply of the $H_2$ gas, in case that the $H_2/O_2$ ratio is within the explosion range.

Meanwhile, when the pressure in the pre-reaction chamber 301 is maintained to the pressure of 3999 Pa or less, the valve 243b is maintained in a state able to be opened, so that the $H_2$ gas is allowed to be supplied into the pre-reaction chamber 301. The valve 243a is also maintained in a state able to be opened, so that the $O_2$ gas is allowed to be supplied into the pre-reaction chamber 301.

Thus, in this embodiment, the pressure sensors 245a, 245b are used as triggers of an interlock, in such a way that the supply of the $H_2$ gas and further the supply of the $O_2$ gas into the pre-reaction chamber 301 are enabled only when the pressure in the pre-reaction chamber 301 is a specific pressure of less than the atmospheric pressure, by monitoring the pressure in the pre-reaction chamber 301 using the pressure sensors 245a, 245b, in at least the oxidizing step in the processing applied to the wafer 200. Such an interlock control is performed by a controller 280 described later.

In at least the oxidizing step in the processing applied to the wafer 200, the pressure information detected by the pressure sensors 245a, 245b may be taken into consideration, when the APC valve 244 is feedback-controlled, based on the pressure information detected by the pressure sensor 245. Namely, in at least the oxidizing step in the processing applied to the wafer 200, the APC valve 244 is feedback-controlled based on the pressure information detected by the pressure sensors 245, 245a, 245b, and may be controlled so that the pressure in the processing chamber 201 is set to a specific pressure of less than the atmospheric pressure, and the pressure in the pre-reaction chamber 301 and the pressure in the piping part are also set to specific pressures of less than the atmospheric pressure. A pressure control part (pressure adjustment part) is mainly constituted of the pressure sensors 245, 245a, 245b, and the APC valve 244.

A seal cap 219 as a furnace throat lid member capable of air-tightly closing a lower end opening of the reaction tube 203, is provided in a lower part of the reaction tube 203. The seal cap 219 is configured to abut on the lower end of the reaction tube 203 from a vertical lower side. The seal cap 219 is made of metal such as stainless, etc., and is formed into a disc shape. An O-ring 220 as a seal member abutted on the lower end of the reaction tube 203, is provided on an upper surface of the seal cap 219. A rotation mechanism 267 for rotating a boat 217 as a substrate holding tool described later, is installed on an opposite side of the processing chamber 201 across the seal cap 129. A rotary shaft 255 of the rotation mechanism 267 is passed through the seal cap 219 and is connected to the boat 217. The rotation mechanism 267 is configured to rotate the wafer 200 by rotating the boat 217. The seal cap 219 is configured to be vertically elevated by a boat elevator 115 as an elevation mechanism vertically installed outside of the reaction tube 203. The boat elevator 115 is configured to load and unload the boat 217 into/from the processing chamber 201 by elevating the seal cap 219.

The boat 217 as a substrate supporting tool, is made of a heat-resistant material such as quartz and silicon carbide, etc., and is configured to support a plurality of wafers 200 in a horizontal posture, with centers thereof aligned, and arranged in multiple stages. A heat insulating member 218 made of the heat-resistant material such as quartz and silicon carbide, etc., is provided in a lower part of the boat 217, so that a heat from the heater 207 is hardly transmitted to the seal cap 219 side. The heat-insulating member 218 may also be configured by a plurality of heat-insulating plates made of the heat-resistant material such as quartz and silicon carbide, etc., and a heat-insulating plate holder for supporting these heat-insulting plates in a horizontal posture in multiple stages.

A temperature sensor 263 as a temperature detector, is installed in the reaction tube 203, and by adjusting a power supply state to the heater 207 based on the temperature information detected by the temperature sensor 263, the temperature in the processing chamber 201 is set to a desired temperature distribution. Similarly to the first nozzle 233 and the second nozzle 233a, the temperature sensor 263 is formed into the L-shape, and is provided along the inner wall of the reaction tube 203. Further, the temperature sensor 263a as a temperature detector is also installed in the pre-reaction chamber 301, and by adjusting the power supply to the second heater 302 based on the temperature information detected by the temperature sensor 263a, the temperature in the pre-reaction chamber 301 is set to a desired temperature.

During processing applied to the wafer 200, the power supply to the first heater 207 is adjusted based on the temperature information detected by the temperature sensor 263, and the temperature in the processing chamber 201 is controlled so as to be set to a first temperature. Further, the power supply to the second heater 302 is adjusted based on the temperature information detected by the temperature sensor 263a, and the temperatures in the processing chamber 201 and the pre-reaction chamber 301 are controlled to the second temperature higher than the first temperature.

Figure 11:
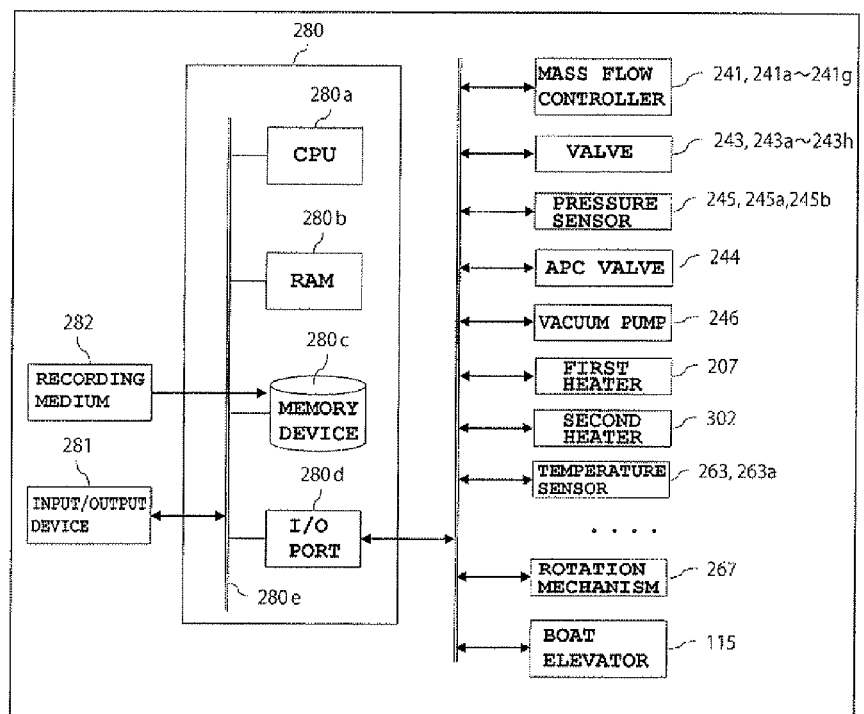
FIG. 11 is a schematic block diagram of a controller of a substrate processing apparatus suitably used in this embodiment.

As shown in FIG. 11, the controller 280 being a control part (control unit) is configured as a computer including CPU (Central Processing Unit) 280a, RAM (Random Access Memory) 280b, a memory device 280c, and an I/O port 280d. The RAM 280b, the memory device 280c, and the I/O port 280d are configured to perform data exchange with CPU 280a via an internal bus 280e. An input/output device 281 configured as a touch panel, etc., is connected to the controller 280.

The memory device 280c includes a flash memory, and HDD (Hard Disk Drive), etc., for example. A control program for controlling an operation of the substrate processing apparatus, and a process recipe, etc., indicating a procedure and a condition, etc., of substrate processing as will be descried later, are readably stored in the memory device 280c. The process recipe is a combination of recipes, so that each procedure in a substrate processing step described later is executed by the controller 280 to obtain a specific result, thus functioning as a program. The process recipe and the control program, etc., are generally simply called a program. The RAM 280b is configured as a memory area (work area) in which the program and data, etc., read by the CPU 280a are temporarily stored.

The I/O port 280d is connected to the above-mentioned mass flow controllers 241, 241a, 241b, 241c, 241d, 241e, 241f, 241g, valves 243, 243a, 243b, 243c, 243d, 243e, 243f, 243g, 243h, pressure sensors 245, 245a, 245b, APC valve 244, vacuum pump 246, first heater 207, second heater 302, temperature sensors 263, 263a, rotation mechanism 267, and boat elevator 115, etc.

The CPU 280a is configured to read and execute the control program from the memory device 280c, and is configured to read the process recipe from the memory device 280c according to an input, etc., of an operation command from the input/output device 281. Then, the CPU 280a is configured to control a gas flow rate adjustment operation by the mass flow controllers 241, 241a, 241b, 241c, 241d, 241e, 241f, 241g, an open/close operation of the valves 243, 243a, 243b, 243c, 243d, 243e, 243f, 243g, 243h, pressure monitoring by the pressure sensors 245, 245a, 245b, a pressure adjustment operation based on the pressure sensor 245 by opening and closing operation of the APC valve, an interlock operation based on the pressure sensors 245a, 245b, a temperature adjustment operation of the first heater 207 based on the temperature sensor 263, a temperature adjustment operation of the second heater 302 based on the temperature sensor 263a, start/stop of the vacuum pump 246, a rotation speed adjustment operation of the rotation mechanism 267, and an elevating operation of the boat 217 by the boat elevator 115, or the like.

The controller 280 may be configured not only as a dedicated computer, but also as a general-purpose computer. For example, a computer-readable recording medium storing the above-mentioned program (for example, a magnetic tape, a magnetic disc such as a flexible disc and a hard disc, etc., an optical disc such as CD and DVD, etc., an optical magnetic disc such as MO, etc., and a semiconductor memory such as a USB memory and a memory card, etc.) 282, is prepared, and by using the recording medium 282, the program is installed in the general-purpose computer, to thereby constitute the controller 280 according to this embodiment. Means for supplying the program to the computer, is not limited to a case of supplying it through the recording medium 282. For example, communication means such as Internet and a dedicated line, etc., may be used, to thereby supply the program not through the recording medium 282.

Next, explanation is given for a sequence example in which the processing furnace of the above-mentioned substrate processing apparatus is used, to thereby form a metal oxide film on the substrate as a high dielectric constant insulating film, as one step of the manufacturing step of the semiconductor device. In the explanation hereafter, an operation of each part constituting the substrate processing apparatus is controlled by the controller 280.

(First Sequence of Film Formation)

Figure 3:
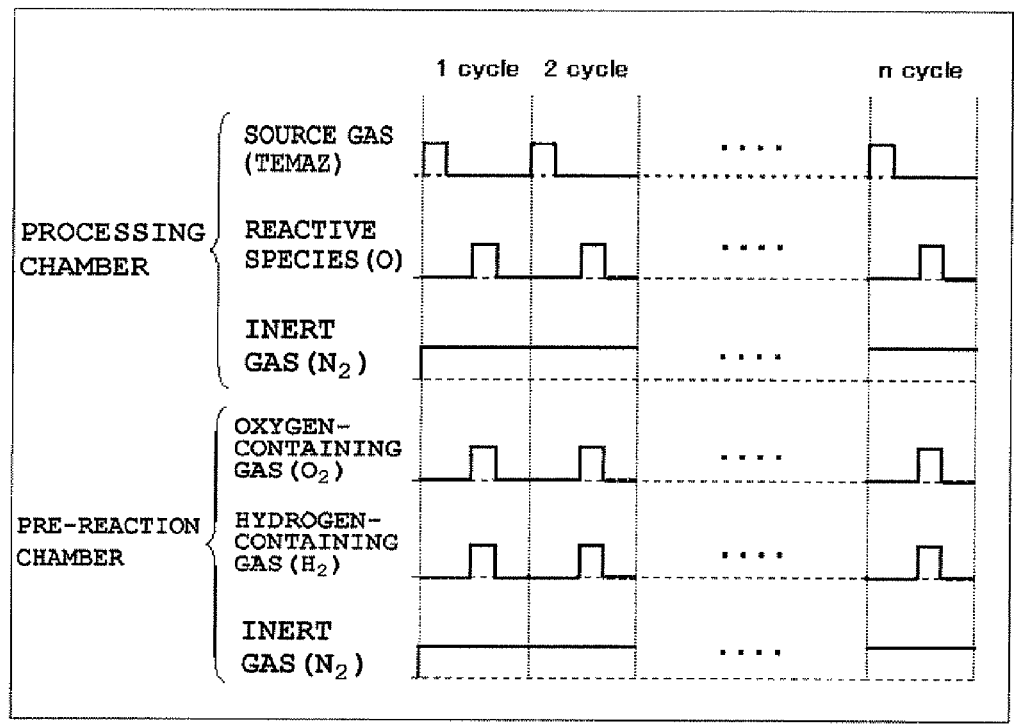
FIG. 3 is a view showing a timing of supplying gases in a first sequence of film formation of this embodiment.

FIG. 3 is a view showing the timing of supplying gases in a first sequence of film formation of this embodiment. An upper side view of FIG. 3 shows a timing of supplying gases into the processing chamber, and a lower side view shows a timing of supplying gases into the pre-reaction chamber. For convenience, FIG. 3 shows a timing of supplying a main substance to be supplied into the processing chamber and the pre-reaction chamber.

In the first sequence of film formation of this embodiment, an oxide film ($ZrO_2$ film) having a specific film thickness is formed on a substrate by alternately repeating: forming a specific element-containing layer (Zr-containing layer) on the substrate by supplying a source gas (TEMAZ gas) containing a specific element, to the substrate housed in a processing chamber and heated to a first temperature; and changing by oxidation the specific element-containing layer formed on the substrate, to an oxide layer ($ZrO_2$ layer) by supplying a reactive species (atomic oxygen (O)) containing oxygen to the substrate heated to the first temperature in the processing chamber under a pressurized atmosphere of less than atmospheric pressure, the reactive species being generated by causing a reaction between an oxygen-containing gas ($O_2$ gas) and a hydrogen-containing gas ($H_2$ gas) in a pre-reaction chamber under a pressurized atmosphere of less than atmospheric pressure and heated to a second temperature higher than the first temperature.

Explanation is given hereafter more specifically. In this embodiment, explanation is given for a case that the TEMAZ gas is used as the source gas, the $O_2$ gas is used as the oxygen-containing gas, and the $H_2$ gas is used as the hydrogen-containing gas, to thereby form a $ZrO_2$ film being a metal oxide film on the substrate as the high dielectric constant insulating film. In the first sequence of film formation of this embodiment, the specific element corresponds to zirconium (Zr) being a metal element, the specific element-containing layer corresponds to a zirconium-containing layer (Zr-containing layer) being a metal element-containing layer, the oxide layer corresponds to a zirconium oxide film ($ZrO_2$ film) being a metal oxide film.

When a plurality of wafers 200 are charged into the boat 217 (wafer charge), as shown in FIG. 1, the boat 217 supporting the plurality of wafers 200 is lifted by the boat elevator 115, and is loaded into the processing chamber 201 (boat load). In this state, the seal cap 219 is in a state of sealing the lower end of the reaction tube 203 through the O-ring 220.

Subsequently, the inside of the processing chamber 201 is vacuum-exhausted by the vacuum pump 246 so as to be a desired pressure (vacuum degree) of less than the atmospheric pressure. At this time, by opening the valve 243h of the reaction gas supply tube 232h, the inside of the pre-reaction chamber 301 is also vacuum-exhausted by the vacuum pump 246 so as to be a desired pressure of less than the atmospheric pressure. Simultaneously, the inside of the piping part (inside of the reaction gas supply tube 232h and inside of the second nozzle 233a) between the pre-reaction chamber 301 and the processing chamber 201 is also vacuum-exhausted by the vacuum pump 246 so as to be a desired pressure of less than the atmospheric pressure. The inside of the pre-reaction chamber 301 is vacuum-exhausted through the reaction gas supply tube 232h, the second nozzle 233a, the processing chamber 201, and the exhaust tube 231. At this time, the pressure in the processing chamber 201 is measured by the pressure sensor 245, and based on the measured pressure information, the APC valve 244 is feedback-controlled (pressure adjustment).

At this time, the pressure at the primary side and the pressure at the secondary side of the pre-reaction chamber 301 are monitored by the pressure sensors 245a, 245b, and whether the pressure in the pre-reaction chamber 301 and the pressure in the piping part are maintained to a specific pressure of less than the atmospheric pressure, is monitored (pressure monitoring). Here, the interlock control is performed in such a way that when the pressure in the pre-reaction chamber 301 is maintained to a specific pressure of less than the atmospheric pressure, namely, when the pressure is maintained to the pressure of 3999 Pa (30 Torr) or less, the $H_2$ gas is allowed to be supplied into the pre-reaction chamber 301, and when the pressure in the pre-reaction chamber 301 is not maintained to the pressure of 3999 Pa or less, namely, when the pressure exceeds 3999 Pa, the $H_2$ is not allowed to be supplied into the pre-reaction chamber 301. The interlock control may also be performed for the supply of the $O_2$ gas into the pre-reaction chamber 301. Further, at this time, the APC valve 244 may be feedback-controlled based on the pressure information measured by the pressure sensors 245, 245a, 245b. The above-mentioned pressure adjustment and pressure monitoring are continuously performed until the processing to the wafer 200 is completed.

The inside of the processing chamber 201 and the wafer 200 in the processing chamber 201 are heated by the first heater 207 so as to be the first temperature. At this time, the power supply to the first heater 207 is feedback-controlled based on the temperature information detected by the temperature sensor 263 so that the inside of the processing chamber 201 is set to a desired temperature distribution (temperature adjustment). Further at this time, the inside of the pre-reaction chamber 301 is heated by the second heater 302 so as to be set to the second temperature higher than the first temperature. At this time, the power supply to the second heater 302 is feedback-controlled based on the temperature information detected by the temperature sensor 263a so that the inside of the pre-reaction chamber 301 is set to a desired temperature.

Subsequently, the wafer 200 is rotated by rotating the boat 217 by the rotation mechanism 267. The rotation of the wafer 200 by rotating the boat 217, is continuously performed at least until the processing to the wafer 200 is completed. Thereafter, four steps described later are sequentially executed.

[Step 1] (Zirconium-Containing Layer Forming Step)

The valve 243 of the source gas supply tube 232 is opened, to thereby flow the TEMAZ gas to the source gas supply tube 232. The TEMAZ gas flows from the source gas supply tube 232, with its flow rate adjusted by the mass flow controller 241. The TEMAZ gas with the flow rate adjusted, is supplied from the gas supply holes 248 of the first nozzle 233, namely from a plurality of places of a region at a side of a wafer arrangement region corresponding to the wafer arrangement region in the processing chamber 201 set in a heated and depressurized state. The TEMAZ gas supplied into the processing chamber 201, flows down in the processing chamber 201 and is exhausted from the exhaust tube 231 through an exhaust port provided at a lower end side of the wafer arrangement region (supply of the TEMAZ gas).

At this time, the valve 243f of the first inert gas supply tube 232f is opened, and the $N_2$ gas may be supplied from the first inert gas supply tube 232f as the inert gas. The $N_2$ gas is supplied into the source gas supply tube 232, with its flow rate adjusted by the mass flow controller 241f. The $N_2$ gas with the flow rate adjusted, is mixed into the TEMAZ gas with the flow rate adjusted in the source gas supply tube 232, and is supplied into the processing chamber 201 set in the heated and depressurized state from the gas supply holes 248 of the first nozzle 233, and is exhausted from the exhaust tube 231. At this time, in order to prevent an invasion of the TEMAZ gas into the second nozzle 233a, the valves 243c, 243d are opened, and the $N_2$ gas may be flowed into the third inert gas supply tube 232c and the fourth inert gas supply tube 232d. The $N_2$ gas is supplied into the processing chamber 201 through the oxygen-containing gas supply tube 232a, the hydrogen-containing gas supply tube 232b, the reaction gas supply tube 232h, and the second nozzle 233a, and is exhausted from the exhaust tube 231.

At this time, the APC valve 244 is properly adjusted, and the pressure in the processing chamber 201 is maintained to the pressure in a range of 1 to 1333 Pa for example. The supply flow rate of the TEMAZ gas controlled by the flow controller 241 is set for example in a range of 10 to 2000 sccm (0.01 to 2 slm). The supply flow rate of the $N_2$ gas controlled by the mass flow controllers 241f, 241c, 241d, is set for example in a range of 100 to 2000 sccm (0.1 to 2 slm). The time for exposing the TEMAZ gas to the wafer 200 is set for example in a range of 1 to 120 seconds. The temperature of the first heater 207 is set so that a CVD reaction is caused in the processing chamber 201 in the above-mentioned pressure zone. Namely, the temperature of the first heater 207 is set so that the temperature of the wafer 200 is set to the first temperature, and for example in a range of 100 to 400° C. When the temperature of the wafer 200 is less than 100° C., the TEMAZ gas is hardly decomposed and is hardly adsorbed on the wafer 200. Further, when the temperature of the wafer 200 exceeds 400° C., the CVD reaction becomes strong, and the uniformity of the film thickness is remarkably deteriorated. Therefore, the temperature of the wafer 200 is preferably set in a range of 100° C. or more and 400° C. or less.

By supplying the TEMAZ gas into the processing chamber 201 under the above-mentioned condition, namely under a condition of generating the CVD reaction, the zirconium-containing layer of about less than one atomic layer to several atomic layers for example, can be formed on the wafer 200 (an underlayer of its surface). The zirconium-containing layer may be an adsorption layer of the TEMAZ gas, or may be the zirconium layer (Zr layer), or may include both of them. Here, the zirconium layer is a general name including a continuous layer made of zirconium (Zr), a discontinuous layer, and a zirconium thin film formed by overlap of these layers. The continuous layer composed of zirconium is also called the zirconium thin film in some cases, Zr forming the zirconium layer also includes a case that bond between Zr and a part of its ligand is not completely cut-off. Further, the adsorption layer of the TEMAZ gas also includes a continuous chemical adsorption layer and a discontinuous chemical adsorption layer, of gas molecules of the TEMAZ gas. Namely, the adsorption layer of the TEMAZ gas includes a chemical adsorption layer of one molecular layer or less than one molecular layer composed of TEMAZ molecules. The TEMAZ molecules forming the adsorption layer of the TEMAZ gas include a case that the bond between Zr and a part of its ligand is cut-off. The layer of less than one atomic layer means an atomic layer formed discontinuously, and the layer of one atomic layer means an atomic layer formed continuously. Further, the layer of less than one molecular layer means a molecular layer formed discontinuously, and the layer of one molecular layer means a molecular layer formed continuously. The zirconium layer is formed by deposition of Zr on the wafer 200 under a condition that the TEMAZ gas is self-decomposed. The adsorption layer of the TEMAZ gas is formed by adsorption of the TEMAZ gas on the wafer 200 under a condition that the TEMAZ gas is not self-decomposed. The film forming rate can be higher preferably in a case of forming the zirconium layer on the wafer 200, than a case of forming the adsorption layer of the TEMAZ gas on the wafer 200. When the thickness of the zirconium-containing layer formed on the wafer 200 exceeds several atomic layers, an oxidizing action in step 3 described later, does not reach the whole body of the zirconium-containing layer. Further, a minimum value of the zirconium-containing layer that can be formed on the wafer 200, is less than one atomic layer. Therefore, the thickness of the zirconium-containing layer is preferably set in a range of about less than one atomic layer to several atomic layers. By setting the thickness of the zirconium-containing layer to one atomic layer or less, namely, to one atomic layer, or less than one atomic layer, actions such as oxidation in step 3 described later can be relatively increased, and the time required for oxidation treatment can be shortened. The time required for forming the zirconium-containing layer in step can also be shortened. As a result, a processing time per one cycle can be shortened, and the processing time in total can also be shortened. Namely, the film forming rate can be increased. Further, by setting the thickness of the zirconium-containing layer to one atomic layer or less, controllability of the uniformity of film thickness can be improved.

As the source gas containing Zr, in addition to tetrakis ethyl methyl amino zirconium ($Zr[N(C_2H_5)(CH_3)]_4$, abbreviated as TEMAZ), an organic source such as tetrakis dimethyl amino zirconium ($Zr[N(CH_3)_2]_4$, abbreviated as TEMAZ), tetrakis diethyl amino zirconium ($Zr[N(C_2H_5)_2]_4$, abbreviated as TDEAZ), and an inorganic source such as zirconium tetra chloride ($ZrCl_4$) may be used. As the inert gas, in addition to the $N_2$ gas, rare gases such as Ar, He, Ne, Xe, etc., may be used.

[Step 2] (Purging Step)

After the zirconium-containing layer is formed on the wafer 200, the valve 243 of the source gas supply tube 232 is closed, to thereby stop the supply of the TEMAZ gas. At this time, the inside of the processing chamber 201 is vacuum-exhausted by the vacuum pump 246 while opening the APC valve 244 of the exhaust tube 231, to thereby remove the remained TEMAZ gas from the processing chamber 201. At this time, the supply of the $N_2$ gas as the inert gas into the processing chamber 201 is maintained while opening the valves 243c, 243d, 243f, 243g. The $N_2$ gas functions as the purge gas, and thus, an effect of removing from the processing chamber 201 the TEMAZ gas unreacted and remained in the processing chamber 201 or after contributing to forming the silicon-containing layer, can be further increased (removal of the remained gas).

The temperature of the first heater 207 is set so that the temperature of the wafer 200 is in a range of 100 to 400° C., similarly to the case of supplying the TEMAZ gas. The supply flow rate of the $N_2$ gas as the purge gas supplied from each inert gas supply system, is set in a range of 100 to 2000 sccm (0.1 to 2 slm) for example respectively. As the purge gas, in addition to the $N_2$ gas, rare gases such as Ar, He, Ne, Xe, etc., may be used.

[Step 3] (Oxidizing Step)

After the remained gas in the processing chamber 201 is removed, the valve 243a of the oxygen-containing gas supply tube 232a is opened, to thereby flow the $O_2$ gas to the oxygen-containing gas supply tube 232a. The $O_2$ gas flows from the oxygen-containing gas supply tube 232a, with the flow rate adjusted by the mass flow controller 241a. The $O_2$ gas with the flow rate adjusted, is supplied into the pre-reaction chamber 301 heated to the second temperature and in the depressurized state. Simultaneously at this time, the valve 243b of the hydrogen-containing gas supply tube 232b is opened, to thereby flow the $H_2$ gas to the hydrogen-containing gas supply tube 232b. The $H_2$ gas flows from the hydrogen-containing gas supply tube 232b, with the flow rate adjusted by the mass flow controller 241b. The $H_2$ gas with the flow rate adjusted, is supplied into the pre-reaction chamber 301 heated to the second temperature and in the depressurized state. The $O_2$ gas and the $H_2$ gas are mixed in the pre-reaction chamber 301 heated to the second temperature and set in the depressurized state (Supply of the $O_2$ gas+$H_2$ gas)

At this time, the valve 243c of the third inert gas supply tube 232c is opened, and the $N_2$ gas may be supplied from the third inert gas supply tube 232c as the inert gas. The $N_2$ gas is supplied into the oxygen-containing gas supply tube 232a, with the flow rate adjusted by the mass flow controller 241c. In this case, a mixed gas of the $O_2$ gas and the $N_2$ gas is supplied from the oxygen-containing gas supply tube 232a. Further at this time, the valve 243d of the fourth inert gas supply tube 232d is opened, and the $N_2$ gas may be supplied from the fourth inert gas supply tube 232d as the inert gas. The $N_2$ gas is supplied into the hydrogen-containing gas supply tube 232b, with the flow rate adjusted by the mass flow controller 241d. In this case, a mixed gas of the $H_2$ gas and the $N_2$ gas is supplied from the hydrogen-containing gas supply tube 232b. As the inert gas, in addition to the $N_2$ gas, rare gases such as Ar, He, Ne, Xe, etc., may be used.

At this time, the APC valve 244 is properly adjusted, and the pressure in the pre-reaction chamber 301 is maintained to the pressure in a range of 1 to 3999 Pa for example, preferably 1 to 2666 Pa, and more preferably 1 to 1333 Pa. Further, the pressure in the piping part between the pre-reaction chamber 301 and the processing chamber 201 is also maintained to the pressure in a range of less than the atmospheric pressure, for example 1 to 3999 Pa, preferably 1 to 2666 Pa, and more preferably 1 to 1333 Pa. The supply flow rate of the $O_2$ gas controlled by the mass flow controller 241a is set for example in a range of 100 to 10000 sccm (0.1 to 10 slm). The supply flow rate of the $H_2$ gas controlled by the mass flow controller 241b is set for example in a range of 100 to 10000 sccm (0.1 to 10 slm). Also, when the $N_2$ gas is supplied, the supply flow rate of the $N_2$ gas controlled by the mass flow controllers 241c, 241d is set for example in a range of 100 to 2000 sccm (0.1 to 2 slm). The temperature of the second heater 302 is set so that the temperature in the pre-reaction chamber 301 is set for example in a range of 450 to 1200° C., preferably 550 to 1100° C., and more preferably 600 to 1000° C. The second temperature is set to a higher temperature than the first temperature.

At this time, $H_2$ gas concentration ($H_2/(H_2+O_2)$) is set for example in a range of 5 to 50%, and preferably 10 to 33%. Namely, the above concentration is obtained for example under a condition that the $O_2$ gas ratio is not less than the $H_2$ gas ration, preferably under a condition that the $O_2$ gas ratio is larger than the $H_2$ gas ratio. Namely an oxygen-rich condition is created. The concentration of the $H_2$ gas can be controlled by adjusting the ratio of the supply flow rate of the $H_2$ gas to the supply flow rate of the $O_2$ gas ($H_2/O_2$ flow rate ratio). For example, when the $H_2$ gas concentration ($H_2/(H_2+O_2)$) is controlled in a range of 5 to 50%, the $H_2/O_2$ flow rate ratio may be adjusted to the flow rate ratio in a range of 0.05 to 1.

At this time, it is also acceptable that the $H_2$ gas concentration ($H_2/(H_2+O_2)$) can be set for example in a range of 67 to 90%, and preferably 67 to 83%. Namely, for example a condition that the $H_2$ gas ratio is larger than the $O_2$ gas ratio, namely a hydrogen-rich condition can be created. As described above, the $H_2$ gas concentration can be controlled by adjusting the $H_2/O_2$ flow rate ratio. For example, when the $H_2$ gas concentration ($H_2/(H_2+O_2)$) is controlled in a range of 67 to 90%, the $H_2/O_2$ flow rate ratio may be adjusted in a range of 2 to 10. Particularly, when a film being an underlayer for forming a $ZrO_2$ film is made of a substance such as a metal film which is easily oxidized, the hydrogen-rich condition is used as the condition, thus making it possible to perform an oxidation treatment under a reducing gas ($H_2$ gas) atmosphere, and also making it possible to apply the oxidation treatment to the zirconium-containing layer while suppressing the oxidation of the underlayer. This will be described later as other film formation sequence.

By supplying the $O_2$ gas and the $H_2$ gas into the pre-reaction chamber 301 under the above-described condition, the $O_2$ gas and the $H_2$ gas are thermally activated and reacted by non-plasma under the heated and depressurized atmosphere, thus generating the reactive species (oxidizing species) containing oxygen such as atomic oxygen (O) (generation of the reactive species). Then, the reactive species generated in the pre-reaction chamber 301, is supplied from a plurality of places in the region at the side part of the wafer arrangement region corresponding to the wafer arrangement region in the processing chamber 201 set in the heated and depressurized state. The reactive species and unreacted $O_2$ gas and $H_2$ gas, etc., supplied into the processing chamber 201, flow down in the processing chamber 201 and are exhausted from the exhaust tube 231 through the exhaust port provided on the lower end side of the wafer arrangement region (supply of the reactive species). At this time, in order to prevent the invasion of the $O_2$ gas and the $H_2$ gas into the first nozzle 233, the valve 243f is opened, and the $N_2$ gas may be flowed into the first inert gas supply tube 232f. The $N_2$ gas is supplied into the processing chamber 201 through the source gas supply tube 232 and the first nozzle 233, and is exhausted from the exhaust tube 231.

At this time, the APC valve 244 is properly adjusted, and the pressure in the processing chamber 201 is maintained to less than the atmospheric pressure, for example in a range of 1 to 1333 Pa. The supply flow rate of the $N_2$ gas controlled by the mass flow controller 241f is set for example in a range of 100 to 2000 sccm (0.1 to 2 slm). The time for exposing the reactive species containing oxygen such as atomic oxygen (O), etc., to the wafer 200 is set for example in a range of 1 to 120 seconds. The temperature of the first heater 207 is set so that the temperature in the processing chamber 201 and the temperature of the wafer 200 are set in a similar temperature zone as the temperature for supplying the TEMAZ gas, namely set to the first temperature, and set for example in a range of 100 to 400° C. The first temperature is set to be lower than the second temperature. It is preferable to set the temperature of the first heater 207 so as to keep the temperature of the wafer 200 in a similar temperature zone in step 1 and step 3. Further, it is more preferable to set the temperature of the first heater 207 so as to keep the temperature of the wafer 200 in a similar temperature zone in step 1 to step 4 (descried later). In this case, the temperature of the first heater 207 is set so that the temperature of the wafer 200 is set to a specific temperature, for example in a range of 100 to 400° C. in step 1 to step 4 (described later).

By supplying the reactive species containing oxygen such as atomic oxygen (O), etc., generated in the pre-reaction chamber 301 and the unreacted $O_2$ gas and the $H_2$ gas, mainly the reactive species are reacted with at least a part of the zirconium-containing layer formed on the wafer 200. Namely, mainly by an action of the reactive species, the oxidation treatment is performed to the zirconium-containing layer, and by this oxidation treatment, the zirconium-containing layer is changed (modified) to a zirconium oxide layer (a $ZrO_2$ layer, also simply called a ZrO layer).

At least a part of the unreacted $O_2$ gas and $N_2$ gas supplied into the processing chamber 201, is thermally activated in the processing chamber 201 under the heated and depressurized atmosphere, thus also generating the reactive species containing oxygen such as atomic oxygen (O), etc., in the processing chamber 201. Then, the reactive species generated in the processing chamber 201 also contribute to the oxidation treatment applied to the zirconium-containing layer. However, an amount of the reactive species that can be generated in a relatively low temperature zone (100 to 400° C.) like in the processing chamber 201 of this embodiment, is limited to be small.

At this time, the valve 243e of the hydrogen-containing gas supply tube 232e is opened, and the $H_2$ gas may be supplied from the hydrogen-containing gas supply tube 232e as the hydrogen-containing gas. The $H_2$ gas is supplied, with the flow rate adjusted by the mass flow controller 241e, from a plurality of places in the region at the side part of the wafer arrangement region corresponding to the wafer arrangement region in the processing chamber 201 set in the heated and depressurized state, through the first nozzle 233. The $H_2$ gas supplied into the processing chamber 201 through the first nozzle 233, flows down in the processing chamber 201 together with the reactive species and the unreacted $O_2$ gas and $H_2$ gas supplied into the processing chamber 201 through the second nozzle 232a, etc., and is exhausted from the exhaust tube 231 through an exhaust port provided on the lower end side of the wafer arrangement region.

In this case, when the $H_2$ gas is supplied into the processing chamber 201 through the first nozzle 233, the $H_2$ gas concentration ($H_2/(H_2+O_2)$) in the processing chamber 201 is set for example in a range of 67 to 90%, and preferably in a range of 67 to 83%. Namely, a hydrogen-rich condition is created. As described above, the $H_2$ gas concentration in the processing chamber 201 can be controlled by adjusting the $H_2/O_2$ flow rate ratio. However, in this case, the $H_2$ gas is supplied from two places of the hydrogen-containing gas supply tube 232b and the hydrogen-containing gas supply tube 232e. Therefore, its total flow rate must be taken into consideration. Thus, by directly supplying the $H_2$ gas from the hydrogen-containing gas supply tube 232e, the hydrogen-rich condition can be created in the processing chamber 201, and the oxidation treatment can be performed under the reducing gas ($H_2$ gas) atmosphere. Further in this case, it is also acceptable that the oxygen-rich condition can be created in the pre-reaction chamber 301 and the hydrogen-rich condition can be created in the processing chamber 201. This sequence is described later as other sequence of film formation.

The $O_2$ gas and the $H_2$ gas are activated by heat and are reacted with each other without activating them by plasma, to thereby generate the reactive species containing oxygen such as atomic oxygen (O) and thermally oxidize the zirconium-containing layer mainly by the action of the reactive species. Thus, a soft reaction can be caused, and the above-mentioned oxidation treatment can be softly performed.

As the oxygen-containing gas, namely as the oxidizing gas, in addition to the oxygen ($O_2$) gas, an ozone ($O_3$) gas, a nitric monoxide (NO) gas, and a nitrous oxide ($N_2O$) gas, etc., may be used. As the hydrogen-containing gas, namely as the reducing gas, in addition to the hydrogen ($H_2$) gas, a heavy hydrogen ($D_2$) gas, an ammonia ($NH_3$) gas, and a methane ($CH_4$) gas, etc., may be used. Namely, as the oxygen-containing gas, at least one of the gases selected from a group consisting of the $O_2$ gas, $O_3$ gas, NO gas, and $N_2O$ gas, can be used, and as the hydrogen-containing gas, at least one of the gases selected from a group consisting of the $H_2$ gas, $D_2$ gas, $NH_3$ gas, and $CH_4$ gas, can be used.

[Step 4] (Purging Step)

After the zirconium-containing layer is changed to the zirconium oxide layer, the valve 232a of the oxygen-containing gas supply tube 232a, and the valves 243a, 243b of the hydrogen-containing gas supply tube 232b, are closed, to thereby stop the supply of the $O_2$ gas and the $H_2$ gas into the pre-reaction chamber 301, and stop the supply of the reactive species containing oxygen such as atomic oxygen (O), etc., into the processing chamber 201. At this time, the inside of the processing chamber 201 is vacuum-exhausted by the vacuum pump 246 while opening the APC valve 244 of the exhaust tube 231, to thereby remove the remained reactive species and a reaction byproduct from the pre-reaction chamber 301 and the processing chamber 201. At this time, the valves 243c, 243d are opened, and the $N_2$ gas as the inert gas is supplied into the processing chamber 201 from each of the third inert gas supply tube 232c and the fourth inert gas supply tube 232d through the pre-reaction chamber 301, and is exhausted from the exhaust tube 231. Further, the valves 243f and 243g are opened, and the $N_2$ gas as the inert gas is supplied into the processing chamber 201 from each of the first inert gas supply tube 232f and the second inert gas supply tube 232g, and is exhausted from the exhaust tube 231. The $N_2$ gas functions as the purge gas, and thus the inside of the pre-reaction chamber 301 and the inside of the processing chamber 201 are purged by the inert gas, and the effect of removing the reactive species and the gas remained in the pre-reaction chamber 301 and the processing chamber 201 can be further increased (removal of the remained gas)

The temperature of the first heater 207 is set so that the temperature of the wafer 200 is set in a range of 100 to 400° C. similarly to the case of supplying the TEMAZ gas. The supply flow rate of the $N_2$ gas as the purge gas supplied from each inert gas supply system, is set for example in a range of 100 to 2000 sccm (0.1 to 2 slm). As the purge gas, in addition to the $N_2$ gas, rare gases such as Ar, He, Ne, and Xe, etc., may be used.

The above-mentioned steps 1 to 4 are set as one cycle, and by executing this cycle a specific number of times, preferably multiple numbers of times, the zirconium oxide film ($ZrO_2$ film, simply called ZrO film hereafter) having a specific film thickness can be formed on the wafer 200. The film thickness of the zirconium oxide film is set for example in a range of 8 to 20 nm.

When the processing of forming the zirconium oxide film having the specific film thickness is ended, the valves 243f, 243g, 243c, and 243d are opened, to thereby supply the $N_2$ gas as the inert gas into the processing chamber 201 from each of the first inert gas supply tube 232f, the second inert gas supply tube 232g, the third inert gas supply tube 232c, and the fourth inert gas supply tube 232d and is exhausted from the exhaust tube 231. The $N_2$ gas functions as the purge gas, and thus, the inside of the processing chamber 201 is purged by the inert gas, and the gas remained in the processing chamber 201 is removed from the processing chamber 201 (Purge). Thereafter, the atmosphere in the processing chamber 201 is replaced by the inert gas, and the pressure in the processing chamber 201 is returned to a normal pressure (return to the atmospheric pressure).

Thereafter, the seal cap 219 is descended by the boat elevator 115, and the lower end of the reaction tube 203 is opened, and the processed wafer 200 is unloaded to outside of the reaction tube 203 from the lower end of the reaction tube 203 in a state of being held by the boat 217 (boat unload). Thereafter, the processed wafer 200 is discharged from the boat 217 (wafer discharge). Thus, a series of processing of forming the zirconium oxide film having the specific film thickness on the wafer 200, is ended.

Incidentally, in the oxidizing step performed by directly supplying the $O_2$ gas and the $H_2$ gas under a depressurized atmosphere in a high temperature zone of 450° C. or more and preferably 550° C. or more in which the wafers are arranged, a large amount of reactive species (oxidizing species) containing oxygen such as atomic oxygen (O), etc., can be generated by a direct reaction between the $O_2$ gas and the $H_2$ gas under the depressurized atmosphere, and a high oxidizability can be expected. However, a source adsorption temperature of the high dielectric insulating film (a metal oxide film) as shown in this embodiment is generally a low temperature of 400° C. or less, and although the oxidizing step is performed under such a low temperature depressurized atmosphere, a thermal energy required for the above-mentioned reaction is insufficient in this temperature zone, and when the $O_2$ gas and the $H_2$ gas are directly supplied under such a low temperature depressurized atmosphere, the reactive species (oxide species) containing oxygen such as atomic oxygen (O), etc., cannot be generated, or even if the reactive species can be generated, the generation amount is limited to a small quantity.

Meanwhile, in the oxidizing step of this embodiment, the $O_2$ gas and the $H_2$ gas are previously reacted in the pre-reaction chamber 301 heated to the second temperature (450 to 1200° C.) higher than the first temperature (100 to 400° C.), under the atmosphere of less than the atmospheric pressure, to thereby generate a large quantity of reactive species (oxide species) containing oxygen such as atomic oxygen (O), etc., and the large quantity of reactive species thus generated, is supplied to the wafer 200 heated to the first temperature (100 to 400° C.) in the processing chamber 201 in the processing chamber 201 under the pressure of less than the atmospheric pressure, to thereby oxidize the zirconium-containing layer formed on the wafer 200, so as to be changed to the zirconium oxide layer.

Thus, according to the oxidizing step of this embodiment, the temperature (second temperature) in the pre-reaction chamber 301 is set to be higher than the temperature (first temperature) of the wafer 200 in the processing chamber 201, and therefore a generation amount of the reactive species containing oxygen such as atomic oxygen (O), etc., obtained by causing a reaction between the $O_2$ gas and the $H_2$ gas, can be more increased than the generation amount of the reactive species obtained by directly supplying the $O_2$ gas and the $H_2$ gas into the processing chamber 201 in which the wafer 200 is housed and is set to have the first temperature which is relatively a low temperature. Thus, the supply amount of the reactive species to the wafer 200, can be more increased than the supply amount of the reactive species to the wafer 200 in a case of directly supplying the $O_2$ gas and the $H_2$ gas. Namely, in a state that the temperature of the wafer 200 is maintained to the first temperature which is relatively a low temperature, the concentration of the reactive species in the processing chamber 201 can be more increased than the case of directly supplying the $O_2$ gas and the $H_2$ gas into the processing chamber 201 in which the wafer 200 is housed, with its temperature maintained to the same temperature, and a large quantity of the reactive species can be provided to the wafer 200.

Further, according to the oxidizing step of this embodiment, the temperature (second temperature) in the pre-reaction chamber 301 is set to be higher than the temperature (first temperature) of the wafer 200 in the processing chamber 201. Therefore, the generation amount of the reactive species containing oxygen such as atomic oxygen (O), etc., obtained by causing the reaction between the $O_2$ gas and the $H_2$ gas, can be set to the same as the generation amount of the reactive species obtained by directly supplying the $O_2$ gas and the $H_2$ gas into the processing chamber 201 in which the wafer 200 is housed and is set to have the second temperature. Thus, the supply amount of the reactive species to the wafer 200 can be set to the same as the supply amount of the reactive species in the case of directly supplying the $O_2$ gas and the $H_2$ gas into the processing chamber 201 in which the wafer 200 is housed and is set to have the second temperature. Namely, the reactive species of the same amount as the case of directly supplying the $O_2$ gas and the $H_2$ gas into the processing chamber 201 in which the wafer 200 is housed and is set to have the second temperature which is relatively a high temperature, can be supplied to the wafer 200, in a state that the temperature of the wafer 200 is maintained to the first temperature, which is relatively a low temperature.

Thus, according to this embodiment, when a low temperature treatment is applied to the wafer 200, the reactive species of the same concentration as the reactive species obtained when a high temperature treatment is applied to the wafer 200, can be supplied to the wafer 200 in a state that the temperature of the wafer is maintained to a low temperature of a limit temperature or less (for example, 400° C. or less in this embodiment) in each kind of process. Thus, in the low temperature treatment applied to the wafer 200, the oxidizability by the reactive species in the oxidizing step can be increased, and the oxidizing step can be performed similarly to the high temperature treatment. Further, by increasing the oxidizability by the reactive species in the oxidizing step, an oxidizing time can also be shortened, and thus, the film forming rate can be improved and productivity can be improved.

Further, according to this embodiment, the $O_3$ gas, and the $O_2$ gas excited by plasma are not used as the oxidizing agent, and therefore there is no necessity for installing an expensive ozonizer or plasma generation unit, etc., in the substrate processing apparatus, and therefore a great cost reduction can be realized. The oxidizing agent used in this embodiment, corresponds to the reactive species containing oxygen such as atomic oxygen (O), etc., and in order to generate the reactive species, at least the pre-reaction vessel 300, the second heater 302, and the pressure sensor 245b may be provided, and a reactive species generation unit can be installed in the substrate processing apparatus at a low cost.

Further, it is confirmed that when the reactive species containing oxygen such as atomic oxygen (O), etc., used as the oxidizing agent in this embodiment, are generated in a temperature zone of 450° C. or more, namely in a temperature zone of at least 450 to 1200° C., the oxidizability is beyond the oxidizability of the $O_3$ gas in the same temperature zone and the oxidizability of the $O_2$ gas excited by plasma. Namely, according to this embodiment, even when the temperature of the wafer 200 (first temperature) is set to a low temperature of 100 to 400° C., by setting the second temperature to 450° C. or more, oxidation can be performed with the oxidizability beyond the oxidizability of the $O_3$ gas in the same temperature zone, and the oxidizability of the $O_2$ gas excited by plasma.

Namely, according to this embodiment, a higher oxidizability can be obtained at a lower cost, than a case of using the $O_3$ gas or the $O_2$ gas excited by plasma as the oxidizing agent, and the oxidizing time can be shortened. Thus, the film forming rate can be more increased than a case of using the $O_3$ gas or the $O_2$ gas excited by plasma as the oxidizing agent, and the productivity can be improved.

Further according to this embodiment, not only the pressure in the pre-reaction chamber 301 and the pressure in the processing chamber 201, but also the pressure in the piping part between the pre-reaction chamber 301 and the processing chamber 201, is maintained to the pressure of less than the atmospheric pressure, during processing applied to the wafer 200. Thus, the reactive species containing oxygen such as atomic oxygen (O) generated in the pre-reaction chamber 301 can be introduced into the processing chamber 201 while suppressing the deactivation of the reaction species containing oxygen such as atomic oxygen (O), etc., generated in the pre-reaction chamber 301.

The energy of the reactive species is higher than a bonding energy of Zr—N, Zr—Cl, Zr—H, Zr—C contained in the zirconium-containing layer to be subjected to the oxidation treatment. Therefore, by adding the energy of the reactive species to the zirconium-containing layer to be subjected to the oxidation treatment, Zr—N, Zr—Cl, Zr—H, and Zr—C bonds contained in the zirconium-containing layer are cut-off. N, Cl, H, C, with the bonds cut-off from Zr, are removed from the zirconium-containing layer, and are discharged as $N_2$, $Cl_2$, $H_2$, HCl, and $CO_2$, etc. Further, an extra bonding hand of Zr as a result of cutting-off the bonds from N, Cl, H, C, is bonded to O contained in the reactive species, thus forming Zr—O bond. Thus, the zirconium-containing layer is oxidized, to thereby form a zirconium oxide layer. Namely, according to the film formation sequence of this embodiment, a good quality zirconium oxide film with extremely low concentration of nitrogen, chlorine, hydrogen, and carbon in the film, can be obtained.

(Second Sequence of Film Formation)

After the $ZrO_2$ film is formed on the wafer 200 by the first sequence of film formation, annealing can also be performed for the purpose of modifying a film quality of the $ZrO_2$ film formed on the wafer 200 by in-situ in the processing chamber 201, without discharging the wafer 200 from the inside of the processing chamber 201 after film formation. By such a modification treatment by annealing, impurities in the $ZrO_2$ film can be further removed, and in-film impurity concentration can be further reduced.

A second sequence of film formation is an example of the method of continuously performing: forming the $ZrO_2$ film on the wafer 200, and modifying the $ZrO_2$ film formed on the wafer 200 by annealing, in the same processing chamber.

Figure 4:
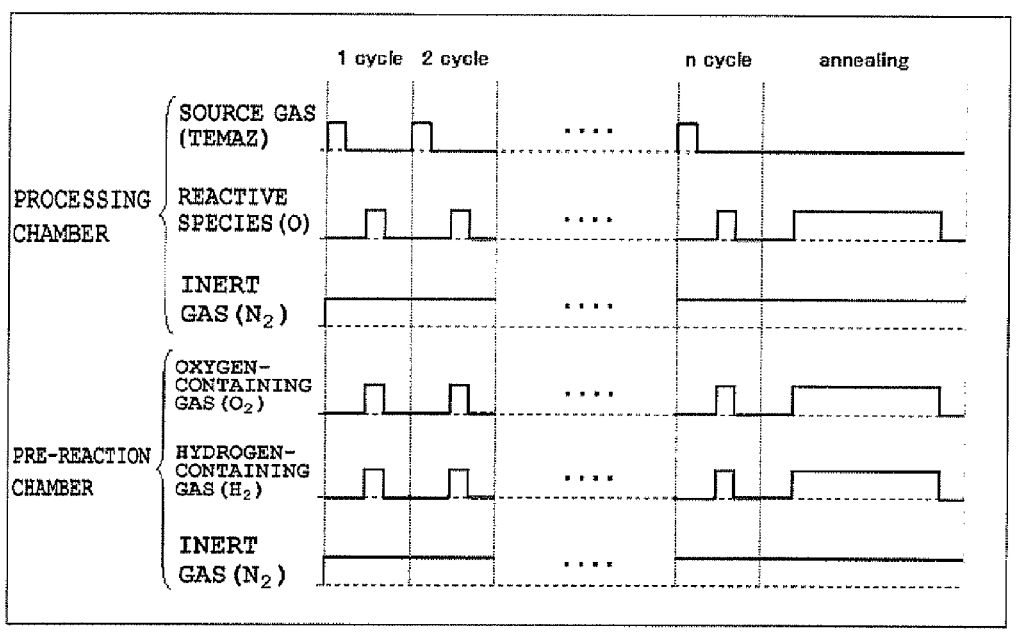
FIG. 4 is a view showing the timing of supplying gases in a second sequence of film formation of this embodiment.

FIG. 4 shows a view showing the timing of supplying gases in the second sequence of film formation of this embodiment. The upper side view of FIG. 4 shows the timing of supplying gases into the processing chamber, and the lower side view of FIG. 4 shows the timing of supplying gases into the pre-reaction chamber. For the convenience, FIG. 4 shows the timing of supplying a main substance supplied into the processing chamber and the pre-reaction chamber.

In the second sequence of film formation of this embodiment, the oxide film ($ZrO_2$ film) having the specific film thickness is formed on the substrate by alternately repeating: forming a specific element-containing layer (Zr-containing layer) on the substrate by supplying the source gas (TEMAZ gas) containing a specific element, to the substrate housed in the processing chamber and heated to a first temperature; and changing by oxidation the specific element-containing layer formed on the substrate, to an oxide layer ($ZrO_2$ layer) by supplying a reactive species (atomic oxygen (O)) containing oxygen to the substrate heated to the first temperature in the processing chamber under a pressurized atmosphere of less than atmospheric pressure, the reactive species being generated by causing a reaction between an oxygen-containing gas ($O_2$ gas) and a hydrogen-containing gas ($H_2$ gas) in the pre-reaction chamber under a pressurized atmosphere of less than atmospheric pressure and heated to a second temperature higher than the first temperature. Thereafter, the oxide film ($ZrO_2$ film) having the specific film thickness formed on the substrate is modified, by supplying the reactive species (atomic oxygen (O)) containing oxygen to the substrate heated to the first temperature or a third temperature in the processing chamber under the pressurized atmosphere of less than atmospheric pressure, the reactive species being generated by causing a reaction between the oxygen-containing gas ($O_2$ gas) and the hydrogen-containing gas ($H_2$ gas) in the pre-reaction chamber under the pressurized atmosphere of less than atmospheric pressure and heated to the second temperature higher than the first temperature. The third temperature is higher than the first temperature, and is lower than the second temperature.

This will be more specifically described hereafter. In the second sequence of film formation of this embodiment, similarly to the first sequence of film formation, explanation is given for an example of forming the $ZrO_2$ film being a metal oxide film as the high dielectric constant insulating film on the substrate, using the TEMAZ gas as the source gas, the $O_2$ gas as the oxygen-containing gas, and the $H_2$ gas as the hydrogen-containing gas, based on the film formation sequence of FIG. 4. In the second sequence of film formation of this embodiment, the specific element corresponds to Zr being a metal element, the specific element-containing layer corresponds to the Zr-containing layer being the metal element-containing layer, the oxide layer corresponds to the $ZrO_2$ layer being the metal oxide layer, and the oxide film corresponds to the $ZrO_2$ film being the metal oxide film.

The processing of forming the $ZrO_2$ film having the specific film thickness on the wafer 200, and purging the inside of the processing chamber 201 with the inert gas, is performed similarly to the first sequence of film formation. Thereafter, the valve 243a of the oxygen-containing gas supply tube 232a is opened, to thereby flow the $O_2$ gas to the oxygen-containing gas supply tube 232a. The $O_2$ gas flows from the oxygen-containing gas supply tube 232a, with the flow rate adjusted by the mass flow controller 241a. The $O_2$ gas with the flow rate adjusted, is supplied into the pre-reaction chamber 301 heated to the second temperature and set in the depressurized state. Simultaneously at this time, the valve 243b of the hydrogen-containing gas supply tube 232b is opened, to thereby flow the $H_2$ gas to the hydrogen-containing gas supply tube 232b. The $H_2$ gas flows from the hydrogen-containing gas supply tube 232b, with the flow rate adjusted by the mass flow controller 241b. The $H_2$ gas with the flow rate adjusted, is supplied into the pre-reaction chamber 301 heated to the second temperature and set in the depressurized state. The $O_2$ gas and the $H_2$ gas are mixed in the pre-reaction chamber 301 heated to the second temperature and set in the depressurized state (supply of the $O_2$ gas+$H_2$ gas).

At this time, the valve 243c of the third inert gas supply tube 232c is opened, and the $N_2$ gas as the inert gas may be supplied from the third inert gas supply tube 232c. Further, the valve 243d of the fourth inert gas supply tube 232d is opened, and the $N_2$ gas as the inert gas may be supplied from the fourth inert gas supply tube 232d.

At this time, the APC valve 244 is properly adjusted, to thereby maintain the pressure in the pre-reaction chamber 301 to the pressure of less than the atmospheric pressure, and set for example in a range of 1 to 3999 Pa, preferably 1 to 2666 Pa, and more preferably 1 to 1333 Pa. Further, the pressure in the piping part between the pre-reaction chamber 301 and the processing chamber 201 is also set to the pressure of less than the atmospheric pressure, and set for example in a range of 1 to 3999 Pa, preferably 1 to 2666 Pa, and more preferably 1 to 1333 Pa. The supply flow rate of the $O_2$ gas controlled by the mass flow controller 241a is set for example in a range of 100 to 10000 sccm (0.1 to 10 slm). The supply flow rate of the $H_2$ gas controlled by the mass flow controller 241b is set for example in a range of 100 to 10000 sccm (0.1 to 10 slm). Further, when the $N_2$ gas is supplied, the supply flow rate of the $N_2$ gas controlled by the mass flow controllers 241c, 241d is set for example in a range of 100 to 2000 sccm (0.1 to 2 slm). The temperature of the second heater 302 is set so that the temperature in the pre-reaction chamber 301 is the second temperature, for example in a range of 450 to 1200° C., preferably 550 to 1100° C., and more preferably 600 to 1000° C. The second temperature is set to be higher than the first temperature.

The $H_2$ gas concentration ($H_2/(H_2+O_2)$) is set for example in a range of 5 to 50%, and preferably 10 to 33%. Namely, for example a condition that the $O_2$ gas ratio is not less than the $H_2$ gas ratio, preferably the condition that the $O_2$ gas ratio is larger than the $H_2$ gas ratio, namely the oxygen-rich condition is created. As described above, the $H_2$ gas concentration can be controlled by adjusting the ratio of the supply flow rate of the $H_2$ gas to the supply flow rate of the $O_2$ gas ($H_2/O_2$ flow rate ratio).

By supplying the $O_2$ gas and the $H_2$ gas into the pre-reaction chamber 301 under the above-mentioned condition, the $O_2$ gas and the $H_2$ gas are thermally activated and reacted by non-plasma under the heated and depressurized atmosphere, thereby generating the reactive species containing oxygen such as atomic oxygen (O), etc. (generation of reactive species). Then, the reactive species generated in the pre-reaction chamber 301 are supplied from a plurality of places in the region at the side part of the wafer arrangement region corresponding to the wafer arrangement region in the processing chamber 201 set in the heated and depressurized state, together with the unreacted $O_2$ gas and $H_2$ gas, etc., through the reaction gas supply tube 232h and the second nozzle 233a. The reactive species and the unreacted $O_2$ gas and $H_2$ gas, etc., supplied into the processing chamber 201, flow down in the processing chamber 201 and are exhausted from the exhaust tube 231 through the exhaust port provided on the lower end side of the wafer arrangement region (supply of the reactive species). At this time, in order to prevent the invasion of the $O_2$ gas and the $H_2$ gas into the first nozzle 233, the valve 243f is opened, and the $N_2$ gas may be flowed into the first inert gas supply tube 232f. The $N_2$ gas is supplied into the processing chamber 201 through the source gas supply tube 232 and the first nozzle 233, and is exhausted from the exhaust tube 231.

At this time, the APC valve is properly adjusted, and the pressure in the processing chamber 201 is maintained to the pressure of less than the atmospheric pressure, and set for example in a range of 1 to 1333 Pa. The supply flow rate of the $N_2$ gas controlled by the mass flow controller 241f is set for example in a range of 100 to 2000 sccm (0.1 to 2 slm). The time for exposing the reactive species containing oxygen such as atomic oxygen (O), etc., to the wafer 200 is set for example in a range of 1 to 600 minutes. Namely, in the modification treatment by annealing, the time for supplying the reactive species to the wafer 200, is set to be longer than the time for supplying the reactive species to the wafer 200 in the oxidizing step when forming the $ZrO_2$ film. The temperature of the first heater 207 is set so that the temperature in the processing chamber 201 and the temperature of the wafer 200 are set in the similar temperature zone as the case of forming the $ZrO_2$ film, namely, set to the first temperature, and set for example in a range of 100 to 400° C. In the modification treatment by annealing, the temperature of the wafer 200 can also be set to a third temperature higher than a wafer temperature during formation of the $ZrO_2$ film, and can be set for example in a range of 400 to 700° C., and preferably 400 to 600° C. However, the first temperature and the third temperature are set to lower temperatures than the second temperature. The temperature of the first heater 207 is preferably set so that the temperature of the wafer 200 is maintained to a similar temperature zone between a film formation time of the $ZrO_2$ film and a modification treatment time, in consideration of the throughput. In this case, the temperature of the first heater 207 is set so that the temperature of the wafer 200 is set to the first temperature and for example so as to be a specific temperature in a range of 100 to 400° C., in a period from the formation of the $ZrO_2$ film to the modification treatment.

By supplying the reactive species containing oxygen such as atomic oxygen (O), etc., and the unreacted $O_2$ gas and the $H_2$ gas generated in the pre-reaction chamber 301 into the processing chamber 201 under the above-mentioned condition, the modification treatment is performed to the $ZrO_2$ film mainly by the action of the reactive species.

At least a part of the unreacted $O_2$ gas and $H_2$ gas supplied into the processing chamber 201, is thermally activated and reacted in the processing chamber 201 under the heated and depressurized atmosphere, and the reactive species containing oxygen such as atomic oxygen (O), etc., are also generated in the processing chamber 201. Then, the reactive species generated in the processing chamber 201 also contribute to the modification treatment applied to the $ZrO_2$ film. However, the generation amount of the reactive species that can be generated in a relatively low temperature zone (100 to 400° C.) like in the processing chamber 201 of this embodiment, is limited to a small quantity.

In this modification treatment, the $O_2$ gas and the $H_2$ gas are thermally activated and reacted without being activated by plasma, to thereby generate the reactive species containing oxygen such as atomic oxygen (O), etc., and mainly by the action of this reactive species, the modification treatment is performed to the $ZrO_2$ film, and thus, the soft reaction can be generated, and also the modification treatment can be softly performed.

In the annealing applied to the $ZrO_2$ film, as described above, the modification treatment is performed to the $ZrO_2$ film by mainly the action of the reactive species containing oxygen such as atomic oxygen (O) generated in the pre-reaction chamber. Then, by the modification treatment, the impurities in the $ZrO_2$ film are removed. According to the modification treatment, a significant effect of removing the impurities in the film can be obtained at a low temperature, compared with annealing and $N_2$ annealing performed as a usual modification treatment. Further, the reactive species having the concentration equivalent to the concentration of the reactive species obtained when the high temperature treatment is performed to the wafer 200 in the state that the temperature of the wafer is maintained to a low temperature of not more than the limit temperature (for example 400° C. or less in this embodiment) in each kind of process, can be supplied to an insulating film to be modified, and thus, reactivity by the reactive species can be improved in the low temperature treatment applied to the wafer 200, and a film quality of the insulating film to be modified, can be improved similarly to the high temperature treatment. Further, by improving the reactivity by the reactive species in the modification treatment, the modification time can be shortened, and thus, the productivity can be improved. It is also confirmed that in such a modification treatment, there is an effect of reducing a natural oxide film of an underlayer of the $ZrO_2$ film.

The energy of the reactive species is higher than the bonding energy of the Zr—N, Zr—Cl, Zr—H, and Zr—C contained in the $ZrO_2$ film. Therefore, by giving the energy of the reactive species, to the $ZrO_2$ to be annealed, Zr—N, Zr—Cl, Zr—H, and Zr—C bonds contained in the $ZrO_2$ film are cut-off. N, H, Cl, and C cut-off from the bond with Zr, are removed from the film, and are discharged as $N_2$, $H_2$, $Cl_2$, HCl, and $CO_2$, etc. Further, the extra bonding hand of Zr as a result of cutting-off the bond from N, H, Cl, C, is bonded with O contained in the reactive species, to thereby form a Zr—O bond. Further, at this time, the $ZrO_2$ film is densified. Thus, the modification treatment is performed to the $ZrO_2$ film. Namely, according to the annealing, an excellent $ZrO_2$ film having extremely low concentrations of nitrogen, hydrogen, chlorine, and carbon in the film, can be obtained.

After end of the modification treatment, similarly to the formation of the $ZrO_2$ film of the first sequence of film formation, purge of the inside of the processing chamber 201, return to the atmospheric pressure, boat unload, and wafer discharge are performed. Thus, a series of the processing of forming the $ZrO_2$ film on the wafer 200, and thereafter modifying the $ZrO_2$ film formed on the wafer 200 by annealing continuously by in-situ, is ended.

(Third Sequence of Film Formation)

Incidentally, when a metal film such as a titanium nitride film (TiN film) is used as a lower electrode of a capacitor such as DRAM (Dynamic Random Access Memory), etc., to thereby form the high dielectric constant insulating film on the metal film as a capacitor insulating film, the metal film such as the TiN film, etc., being the underlayer of the high dielectric constant insulating film is also oxidized by the oxidizing agent used in the oxidizing step for forming the high dielectric constant insulating film, and there is a case that electric characteristics of the metal film (lower electrode) are deteriorated.

A third sequence of film formation is an example of the method of forming a film while suppressing the oxidation of the metal film such as the TiN film, etc., being the underlayer for the film formation, when the high dielectric constant insulating film is formed on the metal film such as a TiN film.

In this specification, the term of the metal film means a film made of a conductive substance containing a metal atom, including a conductive metal nitride film, a conductive metal oxide film, a conductive metal oxynitride film, a conductive metal composite film, a conductive metal alloy film, a conductive metal silicide film, and a conductive metal carbide film, etc., in addition to the conductive metal simple substance film made of metal alone. The TiN film is the conductive metal nitride film.

Figure 5:
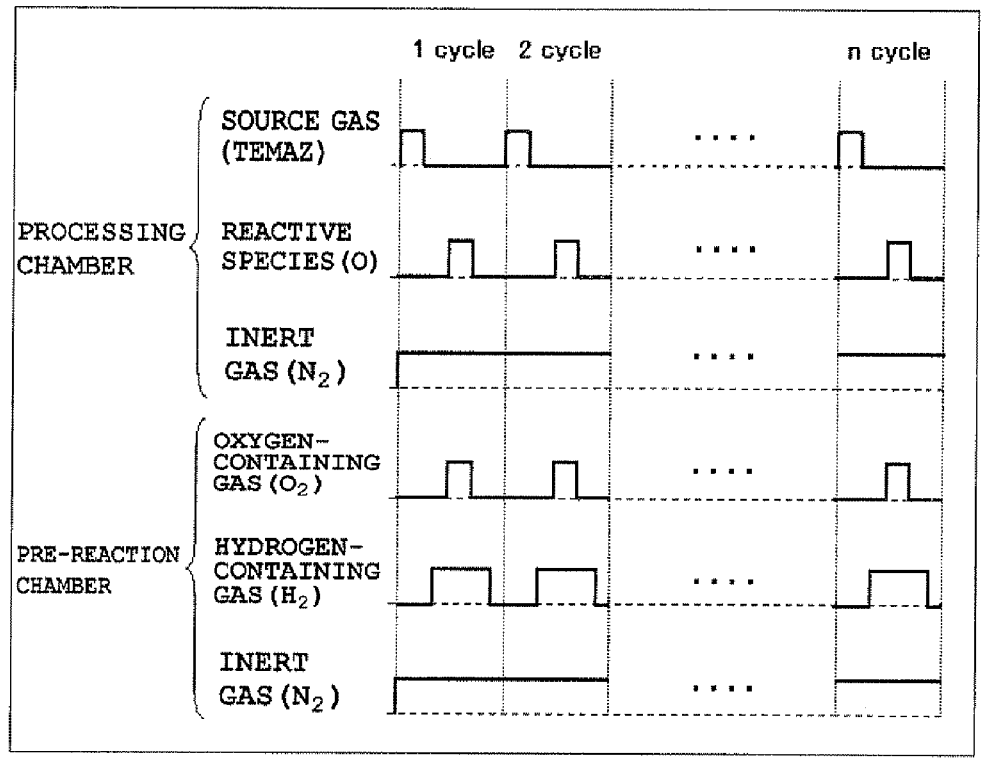
FIG. 5 is a view showing the timing of supplying gases in a third sequence of film formation of this embodiment.

FIG. 5 is a view showing the timing of supplying gases in the third sequence of film formation of this embodiment. The upper side view of FIG. 5 shows the timing of supplying gases into the processing chamber, and the lower side view of FIG. 5 shows the timing of supplying gases into the pre-reaction chamber. FIG. 5 shows the timing of supplying a main substance supplied into the processing chamber and the pre-reaction chamber, for the convenience.

In the third sequence of film formation of this embodiment, the oxide film ($ZrO_2$ film) having the specific film thickness is formed on the metal film on the substrate surface by alternately repeating: forming a specific element-containing layer (Zr-containing layer) on the metal film on the substrate surface by supplying the source gas (TEMAZ gas) containing a specific element, to the substrate housed in the processing chamber and heated to a first temperature, and having the metal film (TiN film) formed on its surface; and changing by oxidation the specific element-containing layer formed on the metal film on the substrate surface, to an oxide layer ($ZrO_2$ layer) by supplying a reactive species (atomic oxygen (O)) containing oxygen to the substrate heated to the first temperature in the processing chamber under a pressurized atmosphere of less than atmospheric pressure, the reactive species being generated by causing a reaction between the oxygen-containing gas ($O_2$ gas) and the hydrogen-containing gas ($H_2$ gas) in the pre-reaction chamber under a pressurized atmosphere of less than atmospheric pressure and heated to a second temperature higher than the first temperature. Then, in changing the specific element-containing layer to the oxide layer, the supply of the hydrogen-containing gas is started before the supply of the oxygen-containing gas is started, and the supply of the hydrogen-containing gas is stopped after the supply of the oxygen-containing gas is stopped. At this time, the specific element-containing layer is oxidized under a hydrogen-containing gas rich condition in which the supply amount of hydrogen-containing gas is larger than the supply amount of the oxygen-containing gas.

This will be more specifically described hereafter. In the third sequence of film formation of this embodiment, similarly to the first sequence of film formation, explanation is given for an example of forming the $ZrO_2$ film being the metal oxide film on the metal film on the substrate surface as the high dielectric constant insulating film, using the TEMAZ gas as the source gas, the $O_2$ gas as the oxygen-containing gas, and the $H_2$ gas as the hydrogen-containing gas, based on the film formation sequence of FIG. 5. In the third sequence of film formation of this embodiment, the metal film corresponds to the TiN film, the specific element corresponds to Zr being the metal element, the specific element-containing layer corresponds to the Zr-containing layer being the metal element-containing layer, the oxide layer corresponds to the $ZrO_2$ layer being the metal oxide layer, and the oxide film corresponds to the $ZrO_2$ film being the metal oxide film.

The third sequence of film formation is different from the first sequence of film formation, and the reason is as follows: the underlayer on which the $ZrO_2$ film is formed, is the TiN film as the metal film; the supply of the $H_2$ gas is started before the supply of the $O_2$ gas is started, and the supply of the $H_2$ gas is stopped after the supply of the $O_2$ gas is stopped, in oxidation in step 3; and at this time, oxidation of the Zr-containing layer is performed under the hydrogen-rich condition. The other content, namely, the other processing procedure and a processing method are the same as those of the first sequence of film formation.

In the oxidation in step 3, the $H_2$ gas concentration ($H_2/(H_2+O_2)$) in the pre-reaction chamber 301 set in the depressurized state and heated to the second temperature, is set for example in a range of 67 to 90%, and preferably 67 to 83%. Namely, the condition in which the $H_2$ gas ratio is larger than the $O_2$ gas ratio, namely, the hydrogen-rich condition is created. As described above, the $H_2$ gas concentration can be controlled by adjusting the $H_2/O_2$ flow rate ratio. For example, when the $H_2$ gas concentration ($H_2/(H_2+O_2)$) is controlled to the concentration in a range of 67 to 90%, the $H_2/O_2$ flow rate ratio is adjusted to the flow rate ratio in a range of 2 to 10. Further, for example, when the $H_2$ gas concentration ($H_2/(H_2+O_2)$) is controlled to the concentration in a range of 67 to 83%, the $H_2/O_2$ flow rate ratio is adjusted to the flow rate ratio in a range of 2 to 5. When the $H_2/O_2$ flow rate ratio is less than 2, oxidation of the TiN film being the underlayer in the film formation, cannot be sufficiently suppressed. When the $H_2/O_2$ flow rate ratio exceeds 10, the film forming rate cannot be set in a practical range. When the $H_2/O_2$ flow rate ratio is set to 5 or less, the film forming rate can be sufficiently set in the practical range. Therefore, the $H_2/O_2$ flow rate ratio is preferably set to 2 or more and 10 or less, and more preferably set to 2 or more and 5 or less.

Thus, by causing the reaction between the $O_2$ gas and the $H_2$ gas under the hydrogen-rich condition in the pre-reaction chamber 301 set in the depressurized state and heated to the second temperature, the amount of the unreacted $H_2$ gas supplied into the processing chamber 201, can be increased, and the hydrogen-rich condition can be created in the processing chamber 201. Namely, the oxidation treatment can be performed by the reactive species containing oxygen such as atomic oxygen (O) under the reducing gas ($H_2$ gas) atmosphere, and the oxidation treatment can be performed to the Zr-containing layer while suppressing the oxidation of the TiN film being the underlayer. At this time, by making the $H_2$ gas flow before/after supplying the reactive species into the processing chamber 201, the oxidation of the TiN film being the underlayer, can be further suppressed.

According to the third sequence of film formation, the similar effect as the first sequence of film formation can be obtained, and also proper film formation can be performed while suppressing the oxidation of the metal film such as the TiN film, etc., being the underlayer.

(Fourth Sequence of Film Formation)

Similarly to the third sequence of film formation, a fourth sequence of film formation is an example of forming the high dielectric constant insulating film while suppressing the oxidation of the metal film such as the TiN film, etc., being the underlayer for the film formation, when the high dielectric constant insulating film is formed on the metal film such as the TiN film.

Figure 6:
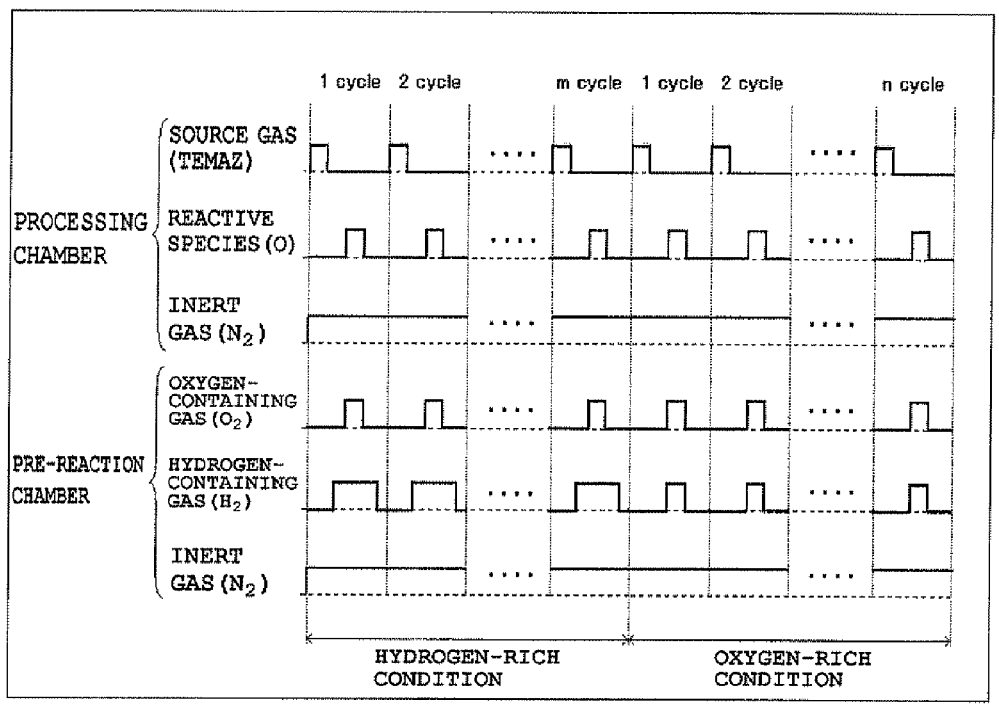
FIG. 6 is a view showing the timing of supplying gases in a fourth sequence of film formation of this embodiment.

FIG. 6 is a view showing the timing of supplying gases in the fourth sequence of film formation of this embodiment. The upper side view of FIG. 6 shows the timing of supplying gases into the processing chamber, and the lower side view of FIG. 6 shows the timing of supplying gases into the pre-reaction chamber. FIG. 6 shows the timing of supplying a main substance supplied into the processing chamber and the pre-reaction chamber.

In the fourth sequence of film formation of this embodiment, a first step of film formation (initial step of film formation) is performed, for forming a first oxide film ($ZrO_2$ film) having a specific film thickness on the metal film on the substrate surface as an initial layer, by alternately repeating a specific number of times (m-times): forming a specific element-containing layer (Zr-containing layer) on the metal film on the substrate surface by supplying the source gas (TEMAZ gas) containing a specific element to the substrate housed in the processing chamber and heated to a first temperature, and having the metal film (TiN film) formed on its surface; and changing by oxidation the specific element-containing layer formed on the metal film on the substrate surface, to an oxide layer ($ZrO_2$ layer) by supplying a reactive species (atomic oxygen (O) containing oxygen to the substrate heated to the first temperature in the processing chamber under a pressurized atmosphere of less than atmospheric pressure, the reactive species being generated by causing a reaction between the oxygen-containing gas ($O_2$ gas) and the hydrogen-containing gas ($H_2$ gas) in the pre-reaction chamber under a pressurized atmosphere of less than atmospheric pressure and heated to a second temperature higher than the first temperature. Then, in changing the specific element-containing layer to the oxide layer in the first step of film formation, the supply of the hydrogen-containing gas is started before the supply of the oxygen-containing gas is started, and the supply of the hydrogen-containing gas is stopped after the supply of the oxygen-containing gas is stopped. Further, at this time, the oxidation of the specific element-containing layer is performed under a hydrogen-containing gas rich condition.

Thereafter, a second step of film formation (main step of film formation) is performed, for forming a second oxide film ($ZrO_2$ film) having a specific film thickness, on the first oxide film by alternately repeating a specific number of times (n-times): forming a specific element-containing layer (Zr-containing layer) on the first oxide film formed in the first step of film formation by supplying the source gas (TEMAZ gas) containing a specific element, to the substrate heated to the first temperature in the processing chamber; and changing by oxidation the specific element-containing layer formed on the first oxide film, to an oxide layer ($ZrO_2$ layer) by supplying the reactive species (atomic oxygen (O)) containing oxygen to the substrate heated to the first temperature in the processing chamber under the pressurized atmosphere of less than atmospheric pressure, the reactive species being generated by causing a reaction between the oxygen-containing gas ($O_2$ gas) and the hydrogen-containing gas ($H_2$ gas) in the pre-reaction chamber under the pressurized atmosphere of less than atmospheric pressure and heated to the second temperature higher than the first temperature. Then, in changing the specific element-containing layer to the oxide layer in the second step of film formation, the oxidation of the specific element-containing layer is performed under an oxygen-containing gas rich condition.

The fourth sequence of film formation of this embodiment corresponds to a case of performing the third sequence of film formation as the first step of film formation, and performing the first sequence of film formation as the second step of film formation, Namely, the oxidation in the first step of film formation is performed under the hydrogen-rich condition, and the oxidation in the second step of film formation is performed under the oxygen-rich condition.

By performing the oxidation at an initial time of the film formation (first step of film formation), the oxidation treatment can be performed to the Zr-containing layer while suppressing the oxidation of the TiN film being the underlayer. Further, in the film formation (second step of film formation) after the first $ZrO_2$ film having the specific film thickness is formed as the initial layer, namely, after the $ZrO_2$ film having a film thickness capable of blocking the oxidation of the TiN film being the underlayer is formed, the oxidation can be performed by increasing an oxidizability under the oxygen-rich condition, and the film forming rate can also be increased. Namely, the first $ZrO_2$ film having the specific film thickness as the initial layer in the fourth sequence of film formation of this embodiment, functions as an oxidation block layer.

The film thickness of the first $ZrO_2$ film as the initial layer, is preferably set to 1 to 5 nm.

When the film thickness of the first $ZrO_2$ film as the initial layer is excessively thin, in the second step of film formation, the TiN film being the underlayer is easily oxidized by the reactive species containing oxygen such as atomic oxygen (O) used as an oxidizing source. Namely, the film thickness of the first $ZrO_2$ film does not function as the oxidation block layer if it is excessively thin. Accordingly, the film thickness of the first $ZrO_2$ film formed in the first step of film formation is preferably set to 1 nm or more.

Further, when the film thickness of the first $ZrO_2$ film is excessively thick, productivity of the film formation treatment is decreased in some cases. In the first step of film formation, the oxidation is performed under the hydrogen-rich condition, and therefore the oxidizability is low compared with a case that the oxidation is performed under the oxygen-rich condition, and the film forming rate becomes relatively decreased. Therefore, when the film thickness of the first $ZrO_2$ film is excessively thick, the time required for the first step of film formation is prolonged, resulting in a relatively longer film forming time in total. Accordingly, the film thickness of the first $ZrO_2$ film formed in the first step of film formation, is preferably set to 5 nm or less.

Namely, the film thickness of the first $ZrO_2$ film formed in the first step of film formation, is the thickness capable of suppressing the oxidation of the TiN film being the underlayer by the reactive species containing oxygen such as atomic oxygen (O) used as the oxidizing source in the second step of film formation, and is preferably set to be thin as much as possible.

Thus, according to the fourth sequence of film formation of this embodiment, in an initial stage of forming the $ZrO_2$ film (first step of film formation), the oxidation of the metal film such as the TiN, etc., being the underlayer, is suppressed by performing the oxidation under the hydrogen-rich condition. When the formation of the first $ZrO_2$ film is completed as the initial layer, the oxidation is performed under the oxygen-rich condition, and the second $ZrO_2$ film is formed while improving the productivity of the film formation treatment, to thereby form a thin film with a total film thickness (total film thickness of the first $ZrO_2$ film and the second $ZrO_2$ film) of 8 to 20 nm for example. Thus, the productivity of the semiconductor device can be improved while suppressing a deterioration of the electric characteristic of the lower electrode.

According to the fourth sequence of film formation, the similar effect as the effect of the first sequence of film formation and the third sequence of film formation can be obtained, and also the film forming rate can be improved in total, compared with the film forming rate of the third sequence of film formation.

(Fifth Sequence of Film Formation)

Similarly to the third sequence of film formation and the fourth sequence of film formation, A fifth sequence of film formation is an example of the method of forming the high dielectric constant insulating film while suppressing the oxidation of the metal film such as the TiN film, etc., being the underlayer for the film formation, when the high dielectric constant insulating film is formed on the metal film such as the TiN film, etc.

Figure 7:
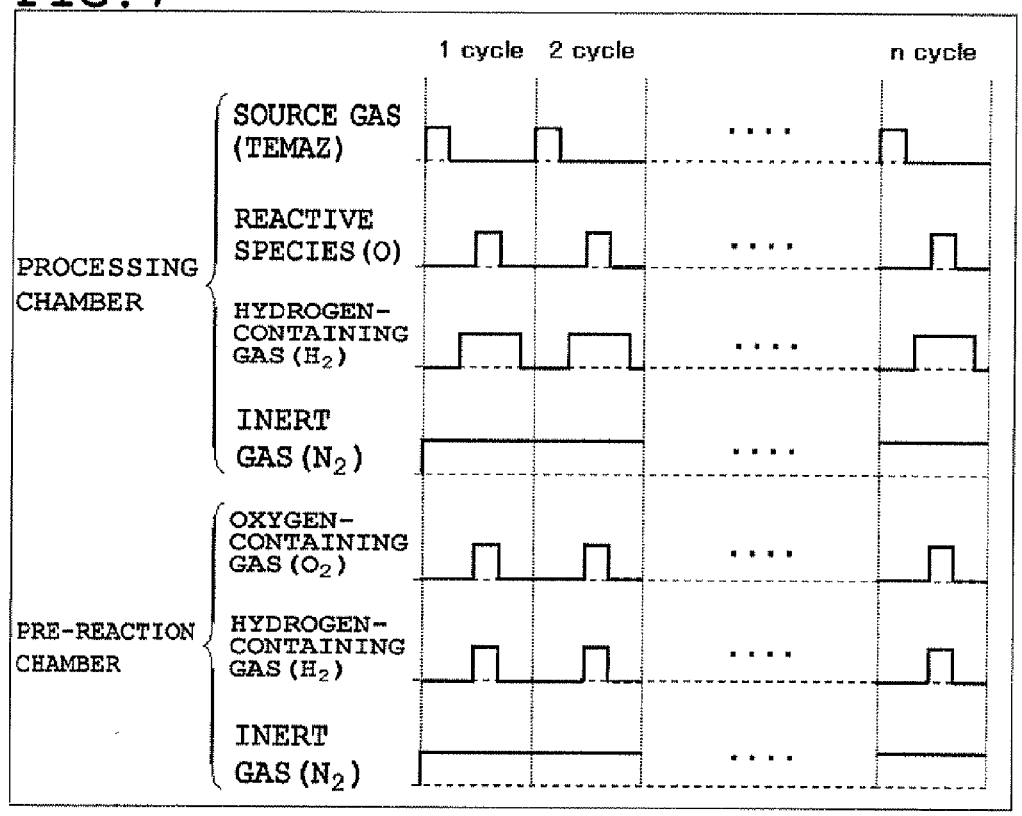
FIG. 7 is a view showing the timing of supplying gases in a fifth sequence of film formation of this embodiment.

FIG. 7 is a view showing the timing of supplying gases in the fifth sequence of film formation of this embodiment. The upper side view of FIG. 7 shows the timing of supplying gases into the processing chamber, and the lower side view of FIG. 7 shows the timing of supplying gases into the pre-reaction chamber. FIG. 7 shows the timing of supplying a main substance supplied into the processing chamber and the pre-reaction chamber, for the convenience.

In the fifth sequence of film formation of this embodiment, the oxide film ($ZrO_2$ film) having the specific film thickness is formed on the metal film on the substrate surface, by alternately repeating: forming a specific element-containing layer (Zr-containing layer) on the metal film on the substrate surface by supplying the source gas (TEMAZ gas) containing a specific element to the substrate housed in the processing chamber and heated to a first temperature, and having the metal film (TiN film) formed on its surface; and changing by oxidation the specific element-containing layer formed on the metal film on the substrate surface, to an oxide layer ($ZrO_2$ layer) by supplying a reactive species (atomic oxygen (O)) containing oxygen to the substrate heated to the first temperature in the processing chamber under a pressurized atmosphere of less than atmospheric pressure, the reactive species being generated by causing a reaction between the oxygen-containing gas ($O_2$ gas) and the hydrogen-containing gas ($H_2$ gas) in the pre-reaction chamber under a pressurized atmosphere of less than atmospheric pressure and heated to a second temperature higher than the first temperature. Then, in changing the specific element-containing layer to the oxide layer, the hydrogen-containing gas ($H_2$ gas) is further directly supplied into the processing chamber, not through the pre-reaction chamber. Further, the supply of the hydrogen-containing gas directly supplied into the processing chamber is started before the supply of the oxygen-containing gas is started, and the supply of the hydrogen-containing gas is stopped after the supply of the oxygen-containing gas is stopped. Further, at this time, the oxidation of the specific element-containing layer is performed under the hydrogen-containing gas rich condition.

A specific explanation will be given hereafter. In the fifth sequence of film formation of this embodiment, similarly to the third sequence of film formation, explanation is given for an example of forming the $ZrO_2$ film being the metal oxide film on the metal film on the substrate surface as the high dielectric constant insulating film, based on the film formation sequence of FIG. 7, using the TEMAZ gas as the source gas, the $O_2$ gas as the oxygen-containing gas, and the $H_2$ gas as the hydrogen-containing gas. In the fifth sequence of film formation of this embodiment, the metal film corresponds to the TiN film, the specific element corresponds to Zr being the metal element, the specific element-containing layer corresponds to the Zr-containing layer being the metal element-containing layer, the oxide layer corresponds to the $ZrO_2$ layer being the metal oxide layer, and the oxide film corresponds to the $ZrO_2$ film being the metal oxide film.

The fifth sequence of film formation is different from the first sequence of film formation, and the reason is as follows: the underlayer forming the $ZrO_2$ film is the TiN film as the metal film; the $H_2$ gas is further directly supplied into the processing chamber not through the pre-reaction chamber in the oxidation in step 3; the supply of the $H_2$ gas is started before the supply of the $O_2$ gas is started, and the supply of the $H_2$ gas is stopped after the supply of the $O_2$ gas is stopped; and further at this time, the oxidation of the Zr-containing layer is performed under the hydrogen-rich condition. The other content, namely, the other processing procedure and processing condition, etc., are the same as those of the first sequence of film formation.

In the oxidation in step 3, the valve 243e of the hydrogen-containing gas supply tube 232e is opened, to thereby supply the $H_2$ gas as the hydrogen-containing gas from the hydrogen-containing gas supply tube 232e. The $H_2$ gas is supplied into the processing chamber 201 in the heated and depressurized state through the first nozzle 233, with the flow rate adjusted by the mass flow controller 241e. The $H_2$ gas supplied into the processing chamber 201 through the first nozzle 233, flows down in the processing chamber 201 together with the reactive species and the unreacted $O_2$ gas and $H_2$ gas, etc., supplied into the processing chamber 201 through the second nozzle 232a, and is exhausted from the exhaust tube 231 through the exhaust port provided on the lower end side of the wafer arrangement region.

At this time, the $H_2$ gas concentration ($H_2/(H_2+O_2)$) in the processing chamber 201 is for example in a range of 67 to 90%, and preferably in a range of 67 to 83%. Namely, the hydrogen-rich condition is created. As described above, the $H_2$ gas concentration in the processing chamber 201 can be controlled by adjusting the $H_2/O_2$ flow rate ratio. However, in this case, the $H_2$ gas is supplied from two places of the hydrogen-containing gas supply tube 232b and the hydrogen-containing gas supply tube 232e, and therefore its total flow rate must be taken into consideration. For example, when the $H_2$ gas concentration ($H_2/(H_2+O_2)$) is controlled to the concentration in a range of 67 to 90%, the $H_2/O_2$ flow rate ratio in total is adjusted to the flow rate ratio in a range of 2 to 10. Further, for example, when the $H_2$ gas concentration ($H_2/(H_2+O_2)$) is controlled to the concentration in a range of 67 to 83%, the $H_2/O_2$ flow rate ratio in total is adjusted to the flow rate ratio in a range of 2 to 5. When the $H_2/O_2$ flow rate ratio in total is less than 2, the oxidation of the TiN film being the underlayer for the film formation, cannot be sufficiently suppressed. When the $H_2/O_2$ flow rate ratio in total exceeds 10, the film forming rate cannot be set in a practical range. When the $H_2/O_2$ flow rate ratio in total is set to 5 or less, the film forming rate can be sufficiently set in the practical range. Therefore, the $H_2/O_2$ flow rate ratio in total is preferably set to 2 or more and 10 or less, and is more preferably set to 2 or more and 5 or less.

Thus, the inside of the processing chamber 201 can be set in the hydrogen-rich state, by directly supplying the $H_2$ gas into the processing chamber 201 from the hydrogen-containing gas supply tube 232e, and the oxidation treatment can be performed by the reactive species containing oxygen such as atomic oxygen (O), etc., under the reducing gas ($H_2$ gas) atmosphere, and the oxidation treatment can be performed to the Zr-containing layer while suppressing the oxidation of the TiN film being the underlayer. At this time, the oxidation of the TiN film being the underlayer can be further suppressed by making the $H_2$ gas flow before/after the reactive species are supplied into the processing chamber 201.

Further at this time, the inside of the pre-reaction chamber 301 can be set in the oxygen-rich state, and the inside of the processing chamber 201 can be set in the hydrogen-rich state. By setting the inside of the pre-reaction chamber 301 in the oxygen-rich state, a larger quantity of reactive species containing oxygen such as atomic oxygen (O), etc., can be generated. Further, when the large quantity of reactive species thus generated under the oxygen-rich condition in the pre-reaction chamber 301, is supplied into the processing chamber 201, an oxidizing rate of the oxidation treatment applied to the Zr-containing layer, namely, the film forming rate can be increased while suppressing the oxidation of the TiN film being the underlayer, by setting the inside of the processing chamber 201 in the hydrogen-rich state.

According to the fifth sequence of film formation, the similar effect as the effect of the first sequence of film formation and the third sequence of film formation can be obtained, and also the film forming rate can be increased while suppressing the oxidation of the metal film of the TiN film, etc., being the underlayer.

(Sixth Sequence of Film Formation)

Similarly to the third sequence of film formation, a sixth sequence of film formation is an example of the method of forming the high dielectric constant insulating film while suppressing the oxidation of the metal film such as the TiN film, etc., being the underlayer for the film formation, when the high dielectric constant insulating film is formed on the metal film such as the TiN film, etc.

Figure 8:
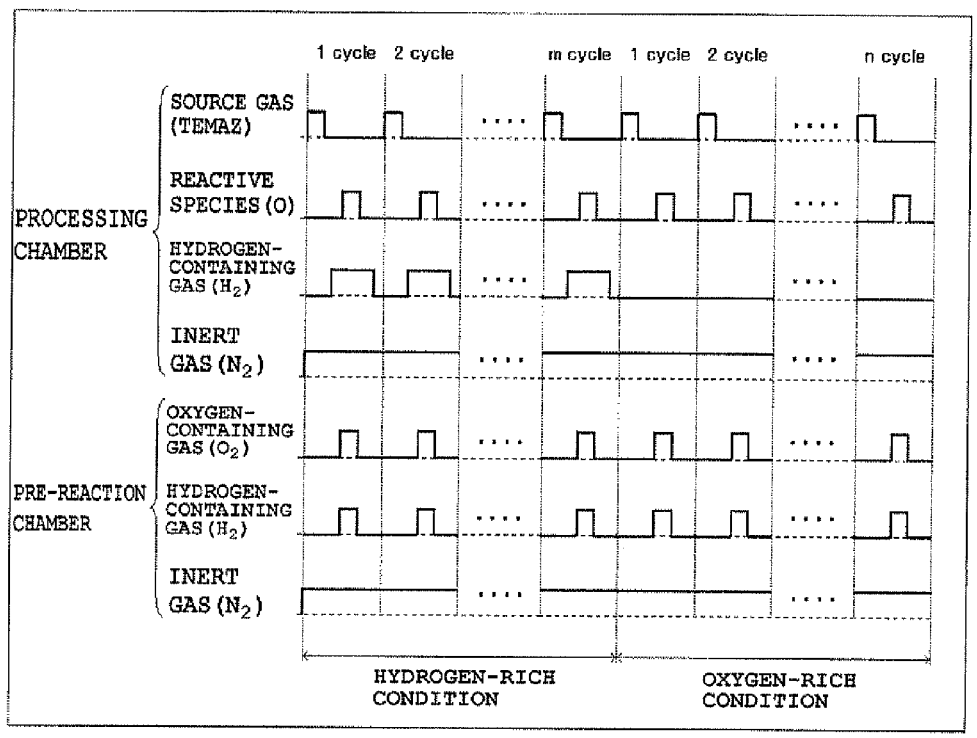
FIG. 8 is a view showing the timing of supplying gases in a sixth sequence of film formation of this embodiment.

FIG. 8 is a view showing the timing of supplying gases in the sixth sequence of film formation of this embodiment. The upper side view of FIG. 8 shows the timing of supplying gases into the processing chamber, and the lower side view of FIG. 8 shows the timing of supplying gases into the pre-reaction chamber. FIG. 8 shows the timing of supplying a main substance supplied into the processing chamber and the pre-reaction chamber, for the convenience.

In the sixth sequence of film formation of this embodiment, the first step of film formation (initial step of film formation) is performed, which is the step of forming the first oxide film ($ZrO_2$ film) having the specific film thickness on the metal film on the substrate surface as the initial layer, by alternately repeating a specific number of times (m-times): forming a specific element-containing layer (Zr-containing layer) on the metal film on the substrate surface by supplying the source gas (TEMAZ gas) containing a specific element, to the substrate housed in the processing chamber and heated to a first temperature, and having the metal film (TiN film) formed on its surface; and changing by oxidation the specific element-containing layer formed on the metal film on the substrate surface, to an oxide layer ($ZrO_2$ layer) by supplying a reactive species (atomic oxygen (O)) containing oxygen to the substrate heated to the first temperature in the processing chamber under a pressurized atmosphere of less than atmospheric pressure, the reactive species being generated by causing a reaction between the oxygen-containing gas ($O_2$ gas) and the hydrogen-containing gas ($H_2$ gas) in the pre-reaction chamber under a pressurized atmosphere of less than atmospheric pressure and heated to a second temperature higher than the first temperature. Then, in changing the specific element-containing layer to the oxide layer in the first step of film formation, the hydrogen-containing gas ($H_2$ gas) is further directly supplied into the processing chamber not through the pre-reaction chamber. Further, the supply of the hydrogen-containing gas directly supplied into the processing chamber is started before the supply of the oxygen-containing gas is started, and the supply of the hydrogen-containing gas is stopped after the supply of the oxygen-containing gas is stopped. Further, at this time, the oxidation of the specific element-containing layer is performed under the hydrogen-containing gas rich condition.

Thereafter, the second step of film formation (main step of film formation) is performed, which is the step of forming the second oxide film ($ZrO_2$ film) having the specific film thickness on the first oxide film by alternately repeating specific number of times (n-times): forming the specific element-containing layer (Zr-containing layer) on the first oxide film formed in the first step of film formation by supplying the source gas (TEMAZ gas) containing a specific element, to the substrate heated to the first temperature in the processing chamber; and changing by oxidation the specific element-containing layer formed on the first oxide film, to an oxide layer ($ZrO_2$ layer) by supplying the reactive species (atomic oxygen (O)) containing oxygen to the substrate heated to the first temperature in the processing chamber under the pressurized atmosphere of less than atmospheric pressure, the reactive species being generated by causing a reaction between the oxygen-containing gas ($O_2$ gas) and the hydrogen-containing gas ($H_2$ gas) in the pre-reaction chamber under the pressurized atmosphere of less than atmospheric pressure and heated to the second temperature higher than the first temperature. In changing the specific element-containing layer to the oxide layer in the second step of film formation, the oxidation of the specific element-containing layer is performed under the oxygen-containing gas rich condition.

The sixth sequence of film formation of this embodiment corresponds to a case that the above-mentioned fifth sequence of film formation is performed as the first step of film formation, and the above-mentioned first sequence of film formation is performed as the second step of film formation. Namely, the oxidation in the first step of film formation is performed under the hydrogen-rich condition, and the oxidation in the second step of film formation is performed under the oxygen-rich condition.

By performing the oxidation at the initial time of the film formation under the hydrogen-rich condition, the oxidation treatment can be applied to the Zr-containing layer while suppressing the oxidation of the TiN film being the underlayer. Further, after the first $ZrO_2$ film having the specific film thickness is formed as the initial layer, namely, after the $ZrO_2$ film is formed, having a film thickness capable of blocking the oxidation of the TiN film being the underlayer, the oxidation can be performed under the oxygen-rich condition, and the film forming rate can be increased. Namely, the first $ZrO_2$ film having the specific film thickness as the initial layer, functions as an oxidation block layer. The film thickness of the first $ZrO_2$ film as the initial layer, is preferably set to 1 to 5 nm, similarly to the initial layer in the fourth sequence of film formation.

According to the sixth sequence of film formation, the similar effect as the effect of the first sequence of film formation and the fifth sequence of film formation can be obtained, and also the film forming rate in total can be improved, compared with the fifth sequence of film formation.

(Seventh Sequence of Film Formation)

Similarly to the third sequence of film formation, a seventh sequence of film formation is an example of the method of forming the high dielectric constant insulating film while suppressing the oxidation of the metal film such as the TiN film being the underlayer for the film formation, when the high dielectric constant insulating film is formed on the metal film such as the TiN film, etc.

Figure 9:
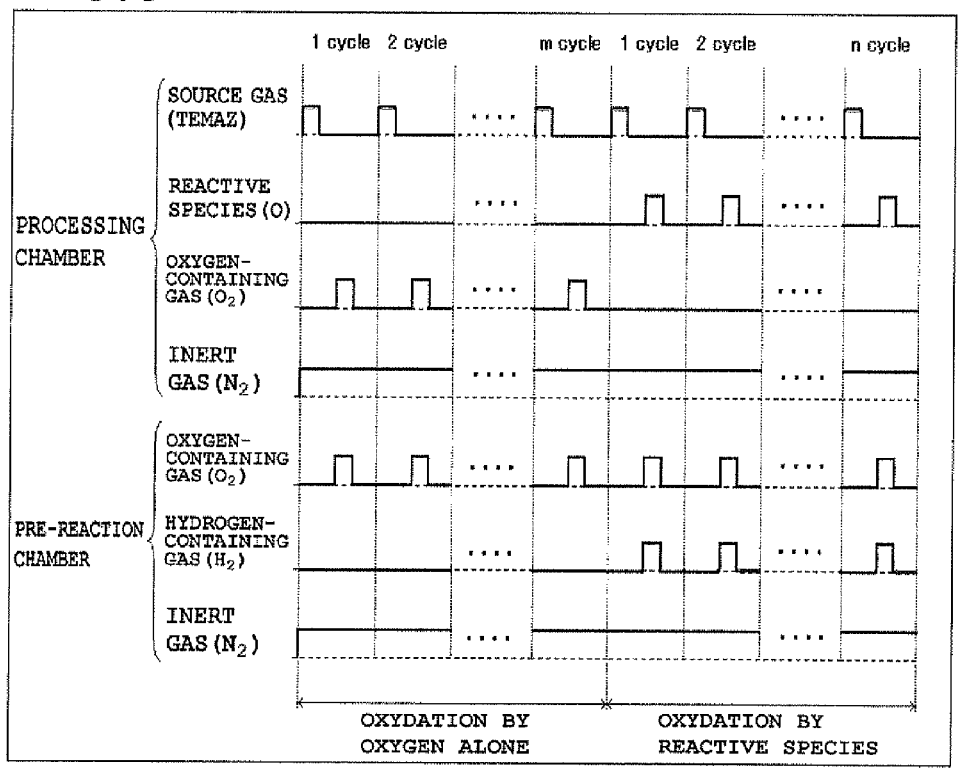
FIG. 9 is a view showing the timing of supplying gases in a seventh sequence of film formation of this embodiment.

FIG. 9 is a view showing the timing of supplying gases in the seventh sequence of film formation of this embodiment. The upper side view of FIG. 9 shows the timing of supplying gases into the processing chamber, and the lower side view of FIG. 9 shows the timing of supplying gases into the pre-reaction chamber. FIG. 9 shows the timing of supplying a main substance supplied into the processing chamber and the pre-reaction chamber, for the convenience.

In the seventh sequence of film formation of this embodiment, the first step of film formation (initial step of film formation) of forming the first oxide film ($ZrO_2$ film) having the specific film thickness on the metal film on the substrate surface as the initial layer, is performed by alternately repeating a specific number of times (m-times): forming a specific element-containing layer (Zr-containing layer) on the metal film on the substrate surface, by supplying the source gas (TEMAZ gas) containing a specific element, to the substrate housed in the processing chamber and heated to a first temperature, and having the metal film (TIN film) formed on its surface; oxidizing the specific element-containing layer formed on the metal film on the substrate surface and changing the specific element-containing layer to an oxide layer ($ZrO_2$ layer) by supplying the oxygen-containing gas ($O_2$) to the substrate heated to the first temperature in the processing chamber under a pressurized atmosphere of less than atmospheric pressure.

Thereafter, the second step of film formation (main step of film formation) is performed, which is the step of forming the second oxide film ($ZrO_2$ film) having the specific film thickness on the first oxide film by alternately repeating a specific number of times (n-times): forming the specific element-containing layer (Zr-containing layer) on the first oxide film formed in the first step of film formation by supplying the source gas (TEMAZ gas) containing a specific element to the substrate heated to the first temperature in the processing chamber; and changing by oxidation the specific element-containing layer formed on the first oxide film, to an oxide layer ($ZrO_2$ layer) by supplying a reactive species (atomic oxygen (O)) containing oxygen to the substrate heated to the first temperature in the processing chamber under the pressurized atmosphere of less than atmospheric pressure, the reactive species being generated by causing a reaction between the oxygen-containing gas ($O_2$ gas) and the hydrogen-containing gas ($H_2$ gas) in the pre-reaction chamber under a pressurized atmosphere of less than atmospheric pressure and heated to a second temperature higher than the first temperature. Then, in changing the specific element-containing layer to the oxide layer, the oxidation of the specific element-containing layer is performed under the oxygen-containing gas rich atmosphere.

In this embodiment, the first step of film formation of the seventh sequence of film formation corresponds to a case of flowing the $O_2$ gas alone for the oxidation in the above-mentioned first sequence of film formation, and the second step of film formation corresponds to the above-mentioned first sequence of film formation. Namely, the oxidation in the first step of film formation is performed under the oxygen atmosphere not containing the reactive species, and the oxidation in the second step of film formation is performed under the oxygen-rich condition containing the reactive species.

By performing the oxidation at the initial time of the film formation under the oxygen atmosphere not containing the reactive species, the oxidizability can be suppressed, and the oxidation treatment can be performed to the Zr-containing layer while suppressing the oxidation of the TiN film being the underlayer. Further, after the first $ZrO_2$ film having the specific film thickness is formed as the initial layer, namely, after the $ZrO_2$ film having a film thickness capable of blocking the oxidation of the TiN film being the underlayer is formed, the oxidation can be performed under the oxygen-rich condition, and the film forming rate can be increased. Namely, the first $ZrO_2$ film having the specific film thickness as the initial layer, functions as the oxidation block layer. Similarly to the initial layer in the fourth sequence of film formation, the film thickness of the first $ZrO_2$ film as the initial layer, is preferably set to 1 to 5 nm.

According to the seventh sequence of film formation, the similar effect as the effect of the first sequence of film formation can be obtained, and also the film formation can be performed while suppressing the oxidation of the metal film such as the TiN film, etc., being the under layer. Further, consumption of the $H_2$ gas can be suppressed, compared with the third to sixth sequence of film formations.

In the seventh sequence of film formation, as shown in FIG. 9, explanation is given for the example of supplying the $O_2$ gas into the processing chamber 201 through the pre-reaction chamber 301 at the time of the oxidation. However, at this time, the $O_2$ gas may be directly supplied into the processing chamber 201 not through the pre-reaction chamber 301. Further, in this case, a $H_2O$ gas or a $H_2O_2$ gas may be used instead of the $O_2$ gas, as the oxygen-containing gas. Namely, the $H_2O$ gas or the $H_2O_2$ gas may be directly supplied into the processing chamber 201 not through the pre-reaction chamber 301, at the time of the oxidation.

(Eighth Sequence of Film Formation)

Similarly to the third sequence of film formation, an eighth sequence of film formation is an example of the method of forming the high dielectric constant insulating film while suppressing the oxidation of the metal film such as the TiN film, etc., being the underlayer for the film formation, when the high dielectric constant insulating film is formed on the metal film such as the TiN film, etc.

Figure 10:
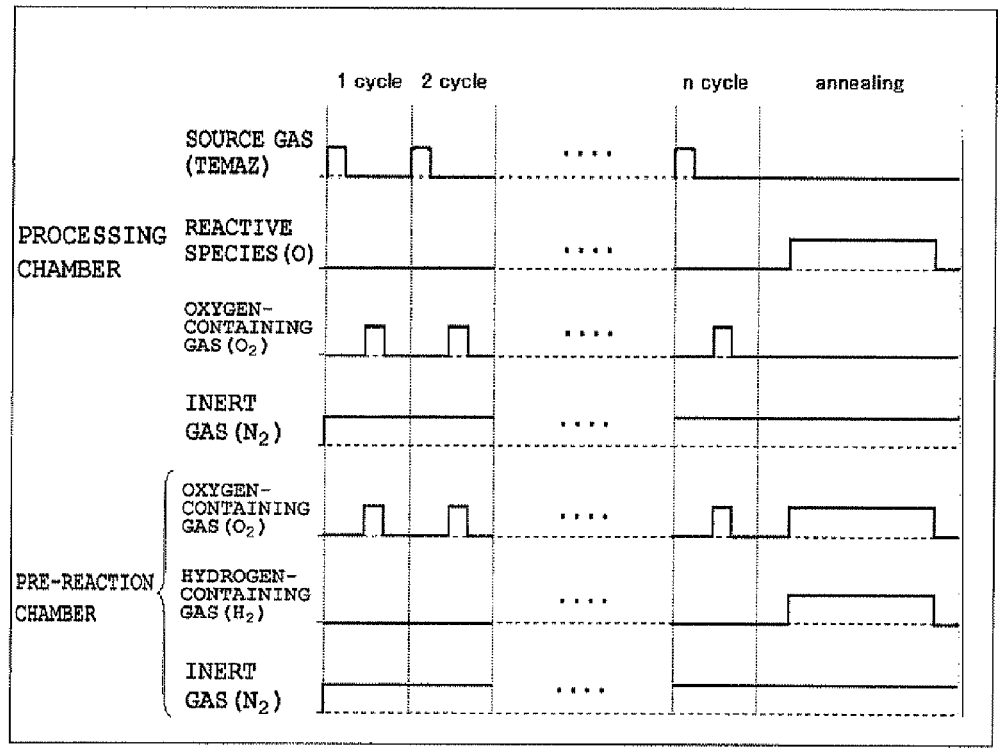
FIG. 10 is a view showing the timing of supplying gases in an eighth sequence of film formation of this embodiment.

FIG. 10 is a view showing the timing of supplying gases in the eighth sequence of film formation of this embodiment. The upper side view of FIG. 10 shows the timing of supplying gases into the processing chamber, and the lower side view of FIG. 10 shows the timing of supplying gases into the pre-reaction chamber. FIG. 10 shows the timing of supplying a main substance supplied into the processing chamber and the pre-reaction chamber for the convenience.

In the eighth sequence of film formation of this embodiment, the oxide film ($ZrO_2$ film) having the specific film thickness, is formed on the metal film on the substrate surface, by alternately repeating: forming a specific element-containing layer (Zr-containing layer) on the metal film on the substrate surface by supplying the source gas (TEMAZ gas) containing a specific element to the substrate housed in the processing chamber and heated to a first temperature, and having the metal film (TIN film) formed on its surface; and oxidizing the specific element-containing layer formed on the metal film on the substrate surface and changing the specific element-containing layer to an oxide layer ($ZrO_2$ layer) by supplying the oxygen-containing gas ($O_2$) gas to the substrate heated to the first temperature in the processing chamber under a pressurized atmosphere of less than atmospheric pressure. Thereafter, the oxide film ($ZrO_2$ film) having the specific film thickness formed on the substrate is modified, by supplying a reactive species (atomic oxygen (O)) containing oxygen to the substrate heated to the first temperature or a third temperature in the processing chamber under the pressurized atmosphere of less than atmospheric pressure, the reactive species being generated by causing a reaction between the oxygen-containing gas ($O_2$ gas) and the hydrogen-containing gas ($H_2$ gas) in the pre-reaction chamber under a pressurized atmosphere of less than atmospheric pressure and heated to a second temperature higher than the first temperature. The third temperature is higher than the first temperature and lower than the second temperature.

The step of film formation of the eighth sequence of film formation of this embodiment corresponds to a case of flowing the $O_2$ gas alone at the time of the oxidation in the above-mentioned first sequence of film formation, and a modifying step corresponds to the modifying step in the above-mentioned second sequence of film formation. Namely, the oxidation in the step of film formation is performed under the oxygen atmosphere not containing the reactive species, and the modification in the modifying step is performed under the oxygen-rich condition containing the reactive species.

By performing the oxidation in the step of film formation under the oxygen atmosphere not containing the reactive species, the oxidizability can be suppressed, and the oxidation treatment can be applied to the Zr-containing layer while suppressing the oxidation of the TiN film being the underlayer. Further, after the $ZrO_2$ film having the specific film thickness is formed, the $ZrO_2$ film itself functions as the oxidation block layer for blocking the oxidation of the TiN film being the underlayer. Therefore, modification treatment can be applied to the $ZrO_2$ film while suppressing the oxidation of the TiN film being the underlayer, under the oxygen-rich condition including the reactive species, and a modification treatment time can be shortened. It is also confirmed that the modification treatment has an effect of reducing a natural oxide film (Ti—O bond) of the TiN film being the underlayer for the film formation of the $ZrO_2$ film.

According to the eighth sequence of film formation, the similar effect as the effect of the second sequence of film formation can be obtained, and also the film formation can be performed while suppressing the oxidation of the metal film such as the TiN film, etc., being the underlayer. Further, the consumption of the $H_2$ gas can be suppressed, compared with third to sixth sequence of film formations.

As described above, embodiment s of the present invention have been specifically described. However, the present invention is not limited to the above-mentioned embodiment s, and can be variously modified in a range not departing from the gist of the invention.

For example, in the above-mentioned embodiment s, explanation is given for an example of forming the $ZrO_2$ film containing zirconium (Zr) being the metal element, as the high dielectric constant insulating film. However, the present invention can also be applied to a case of forming a film containing metal elements such as zirconium (Zr), hafnium (Hf), titanium (Ti), aluminum (Al), niobium (Nb), tantalum (Ta), and molybdenum (Mo), etc. For example, the present invention can also be applied to a case of forming a zirconium silicate (ZrSiO film), a zirconium aluminate film (ZrAlO film), a hafnium oxide film ($HfO_2$ film), a hafnium silicate film (HfSiO film), a hafnium aluminate film (HfAlO film), a titanium oxide film ($TiO_2$ film), an aluminum oxide film ($Al_2O_3$ film), a niobium oxide film ($Nb_2O_4$ film), a tantalum oxide film ($Ta_2O_5$ film), a molybdenum oxide film ($MoO_2$ film), etc., and the high dielectric constant insulating film obtained by combining or mixing them.

For example, when the $HfO_2$ film is formed as a film containing Hf, not only an organic source such as tetrakis dimethyl amino hafnium ($Hf[N(C_2H_5)(CH_3)]_4$, abbreviated as TDMAH), tetrakis dimethyl amino hafnium ($Hf[N(CH_3)_2]_4$, abbreviated as TDMAH), and tetrakis diethyl amino hafnium ($Hf[N(C_2H_5)_2]_4$, abbreviated as TDEAH), but also an inorganic source such as tetra chloro hafnium, namely hafnium tetrachloride ($HfCl_4$) can be used as a source containing Hf. The similar processing condition as the processing condition described in the above-mentioned embodiment, can be used as the processing condition at this time.

Further for example, when the $TiO_2$ film is formed as the film containing Ti, not only an organic source such as tetrakis ethyl methyl amino titanium ($Ti[N(C_2H_5)(CH_3)]_4$, abbreviated as TEMAT), tetrakis dimethyl amino titanium ($Ti[N(CH_3)_2]_4$, abbreviated as TDMAT), and tetrakis diethyl amino titanium ($Ti[N(C_2H_5)_2]_4$, abbreviated as TDEAT), but also an inorganic source such as tetra chloro titanium, namely titanium tetrachloride ($TiCl_4$) can be used as a source containing Ti. The similar processing condition as the processing condition described in the above-mentioned embodiment, can be used as the processing condition at this time.

Further for example, when the $Al_2O_3$ film is formed as the film containing Al, not only an organic source such as trim-ethyl aluminum ($Al(CH_3)_3$, abbreviated as TMA), but also an inorganic source such as trichloro aluminum, namely aluminum chloride ($AlCl_3$), trifluoro aluminum namely aluminum trifluoride ($AlF_3$) can be used. The similar processing condition as the processing condition described in the above-mentioned embodiment, can be used as the processing condition at this time.

Further for example, when the $Nb_2O_5$ film is formed as the film containing Nb, penta chloro niobium namely niobium penta chloride ($TaCl_5$), and penta fluoro niobium namely niobium penta fluoride ($NbF_5$), etc., can be used, as the source containing Nb.

Further for example, when the $Ta_2O_5$ film is formed as the film containing Ta, penta chloro tantalum namely tantalum penta chloride ($TaCl_5$), penta fluoro tantalum namely tantalum penta fluoride ($TaCl_5$), penta fluoro tantalum namely tantalum penta fluoride ($TaF_5$), penta ethoxy tantalum ($Ta(OC_2H_5)_5$, abbreviated as PET), tris diethyl amino tertiary butyl imino tantalum ($Ta(NC(CH_3)_3)(N(C_2H_5)_2)_3$, abbreviated as TBTDET), etc., can be used as the source containing Ta.

Further for example, when the $MoO_2$ film is formed as the film containing Mo, penta chloro molybdenum namely molybdenum penta chloride ($MoCl_5$), and penta fluoro molybdenum namely molybdenum penta fluoride ($MoF_5$), etc., can be used as the source.

Further for example, in the above-mentioned embodiment, explanation is given for an example of forming the metal oxide film containing a metal element. However, the present invention can also be applied to a case of forming a semiconductor oxide film containing a semiconductor element such as silicon (Si), etc., and forming each kind of insulating film such as a silicon oxide film ($SiO_2$ film), etc., at a low temperature.

For example, when the $SiO_2$ film is formed as the film containing Si, a chloro silane-based inorganic source such as hexa chloro disilane ($Si_2Cl_6$, abbreviated as HOD), tetra chloro silane namely silicon tetra chloride ($SiCl_4$, abbreviated as STC), trichloro silane ($SiHCl_3$, abbreviated as TCS), dichloro silane ($SiH_2Cl$, abbreviated as DOS), mono chloro silane ($SiH_3Cl$, abbreviated as MCS), and the inorganic source such as mono silane ($SiH_4$), etc., or an amino silane-based organic source such as tetrakis dimethyl amino silane ($Si[N(CH_3)_2]_4$, abbreviated as 4DMAS), tris dimethyl amino silane ($Si[N(CH_3)_2]_3H$, abbreviated as 3DMAS), bis dimethyl amino silane ($Si[N(C_2H_5)_2]_2H_2$, abbreviated as 2DEAS), bis tertiary butyl amino silane ($SiH_2[NH(C_4H_9)]_2$, abbreviated as BTBAS), can be used as the source containing Si. The similar processing condition as the processing condition described in the above-mentioned embodiment, can be used as the processing condition at this time. Namely, according to the present invention, a good quality $SiO_2$ film can be formed at a low temperature, for example, at 400° C. or less, at a high film forming rate.

When the $SiO_2$ film is formed, and there is no limit temperature in its process, a treatment temperature, namely, the first temperature can be set to 400° C. or more. For example, the first temperature can be set to 100° C. or more and 600° C. or less. In a case of the $SiO_2$ film, the film quality can be more improved by setting the treatment temperature to be relatively high, than a case of performing a low temperature treatment. If the first temperature is excessively high, a vapor phase reaction is dominant during supply of the silicon source gas, thus deteriorating the uniformity of the film thickness, and its control becomes difficult. By setting the first temperature to 600° C. or less, a surface reaction is dominant during supply of the silicon source gas, and the uniformity of the film thickness is easily secured, and its control can be easy. Therefore, the first temperature is preferably set to 100° C. or more and 600° C. or less. Similarly to the above-mentioned embodiment, the second temperature may be set to 450° C. or more and 1200° C. or less, which is a temperature zone where the oxygen-containing gas and the hydrogen-containing gas are reacted, and the reactive species such as atomic oxygen (O), etc., can be generated. When the first temperature is set to 100° C. or more and 600° C. or less, the second temperature is preferably set to 600° C. or more and 1200° C. or less. In this case, a further better quality $SiO_2$ film can be formed than a case of forming the $SiO_2$ film by setting the second temperature to 450° C. or more and 1200° C. or less.

An effect of removing the impurities of each kind of the insulating films by annealing in the second sequence of film formation and the eighth sequence of film formation will be focused next. Then, it is confirmed that when the anneal treatment is used for modifying the silicon oxide film in the above-mentioned embodiment, particularly the H-concentration and the Cl-concentration in the impurities in the film can be reduced, and meanwhile, when the annealing treatment of the above-mentioned embodiment is used for modifying the metal oxide film, particularly the H-concentration, the Cl-concentration, the C-concentration, and the N-concentration in the impurities in the film can be reduced.

Further for example, in the above-mentioned embodiment, explanation is given for an example of setting the second temperature to a higher temperature than the first temperature (second temperature>first temperature). However, the second temperature may be equal to the first temperature (second temperature=first temperature). Namely, the temperature in the pre-reaction chamber can be equal to the temperature in the processing chamber. As shown in the example of the above-mentioned $SiO_2$ film, this is effective particularly in a process without limit temperature, and particularly, this is effective when the first temperature can be set to 450° C. or more (the temperature allowing the reaction to occur between the oxygen-containing gas and the hydrogen-containing gas, and generating the reactive species such as atomic oxygen (O), etc.).

For example in this case, both the temperature in the pre-reaction chamber and the temperature in the processing chamber are set to the first temperature, and the reaction is started between the oxygen-containing gas and the hydrogen-containing gas in the pre-reaction chamber set in the depressurized state and heated to the first temperature, and the reaction can be advanced in the processing chamber set in the depressurized state and heated to the first temperature, and the concentration of the atomic oxygen obtained at this temperature can be maximum. In this case, the reaction between the oxygen-containing gas and the hydrogen-containing gas is not started in the processing chamber, but is started in the pre-reaction chamber, and the pre-reaction chamber functions as a buffer of adjusting reaction delay time between the oxygen-containing gas and the hydrogen-containing gas. In this case, 450 to 600° C. can be given for example as the first temperature.

Thus, even if the second temperature is set to be equal to the first temperature, the delay time between the oxygen-containing gas and the hydrogen-containing gas in a low temperature zone can be improved. Namely, not only by setting the second temperature to be higher than the first temperature (second temperature>first temperature), but also by setting the second temperature to be equal to the first temperature (second temperature=first temperature), namely, by setting the second temperature to be not less than the first temperature (second temperature first temperature), the reaction delay between the oxygen-containing gas and the hydrogen-containing gas at the low temperature zone can be improved.

Further, in the above-mentioned embodiment, explanation is given for an example of performing film formation using the batch type substrate processing apparatus for processing a plurality of substrates at once. However, the present invention is not limited thereto, and can be suitably applied to a case that the film formation is performed using a single wafer processing type substrate processing apparatus for processing one or a plurality of substrates at once.

Figure 12:
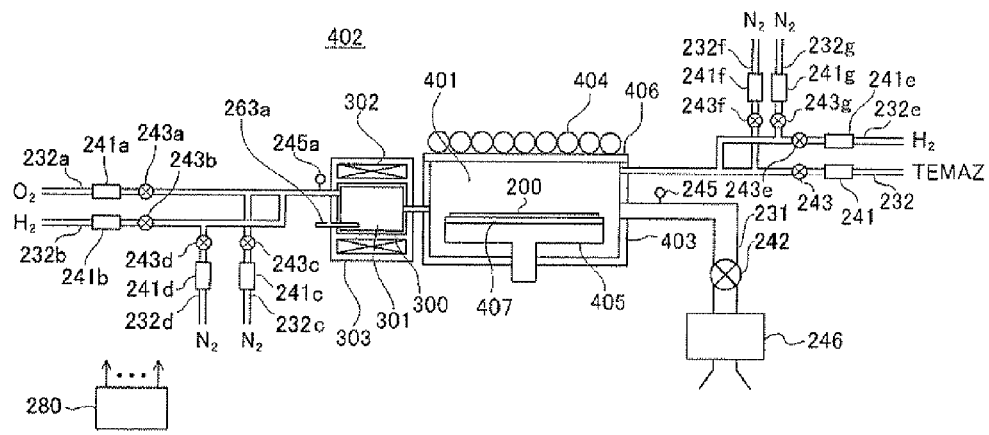
FIG. 12 is a schematic block diagram of a single wafer processing furnace of a substrate processing apparatus according to a modified example of this embodiment, and is a view showing a processing furnace portion in a vertical cross-sectional view.

For example, as shown in FIG. 12, the present invention can be suitably applied to a case that the substrate processing apparatus having a first heating source not as a resistance heating heater but as a lamp heater, and having a single wafer processing cold wall type processing furnace for heating a wafer by light irradiation to the wafer using a lamp, namely by an energy by light absorption of the wafer, is used to perform film formation. A processing furnace 402 of this modified example has a processing vessel 403 forming a processing chamber 401; a lamp 404 as a first heating source; a quartz window 406 for transmitting a light; and a supporting table 407 including a susceptor 407 for supporting one wafer 200 in a horizontal posture. Further, in the processing furnace 402 of this modified example, the piping part connecting the pre-reaction chamber 301 and the processing chamber 401 is eliminated, so that the pre-reaction chamber 301 and the processing chamber 401 are directly connected. In FIG. 12, the same signs and numerals are assigned to substantially the same element as the element described in FIG. 1 and FIG. 2, and explanation thereof is omitted.

Figure 13:
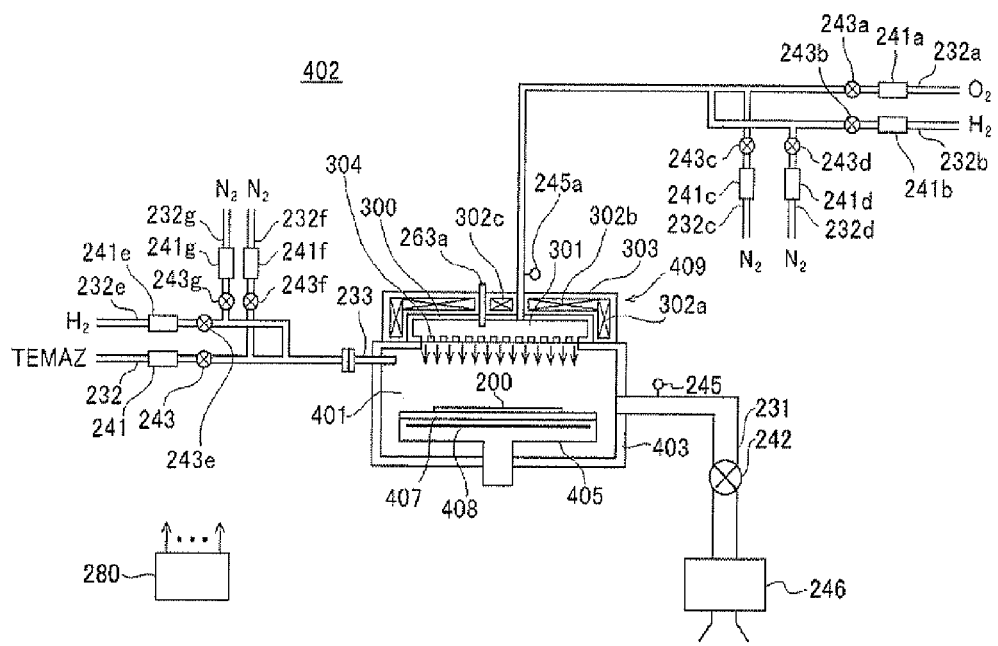
FIG. 13 is a schematic block diagram of the single wafer processing furnace of the substrate processing apparatus according to a modified example of this embodiment, and is a view showing the processing furnace portion in a vertical cross-sectional view.

Further for example, as shown in FIG. 13, the present invention can also be suitably applied to a case that the film formation is performed using the substrate processing apparatus in which the pre-reaction chamber is provided to a shower head, namely, using the substrate processing apparatus in which the shower head portion has a function of the pre-reaction chamber. The processing furnace 402 of this embodiment has the processing vessel 403 forming the processing chamber 401; the shower head 409 that supplies a gas into the processing chamber 401 in a shower state; the supporting table 405 including the susceptor 407 for supporting one wafer 200 in a horizontal posture; and a resistance heating heater 408 as the first heating source provided on the supporting table 405. The shower head 409 has the pre-reaction vessel 300 with the pre-reaction chamber 301 formed inside; second heaters 302a, 302b, 302c provided so as to surround a side face and an upper face of a cylindrical body of the pre-reaction vessel 300; and a heat insulating member 303 provided around the pre-reaction vessel 300 and the second heaters 302a, 302b, 302c. A joint piping part is connected to an inlet of the shower head 409, where the oxygen-containing gas supply tube 232a and the hydrogen-containing gas supply tube 232b are joined, and a gas dispersion plate 304 is provided to an outlet so that the gas is supplied into the processing chamber 401 in a shower state. In FIG. 13, substantially the same sings and numerals are assigned to the same element described in FIG. 1 and FIG. 2.

According to a modified example shown in FIG. 12, by using the pre-reaction chamber 301 heated to a high temperature, a generation amount of the reactive species such as atomic oxygen (O) can be increased, and the concentration of the reactive species can be remarkably increased. Therefore, even in a case that the cold wall type chamber is used for heating the wafer by light irradiation, the film quality can be improved by the low temperature treatment, similarly to the high temperature treatment, and the film forming rate can be increased similarly to the high temperature treatment. Further, according to the modified examples shown in FIG. 12 and FIG. 13, the piping part connecting the pre-reaction chamber 301 and the processing chamber 201 (401) is eliminated, so that the pre-reaction chamber 301 and the processing chamber 201 (401) are directly connected. Therefore, deactivation of the reactive species such as atomic oxygen (O), etc., generated in the pre-reaction chamber 301 can be prevented. Further, since the piping part is eliminated, a pressure monitoring in the piping part and a pressure adjustment in the piping part can be eliminated, and a structure of the substrate processing apparatus and a pressure control operation can be simplified.

Further, the present invention is not limited to the above-mentioned each embodiment and modified example, and each embodiment and each element of the modified example may be arbitrarily and suitably combined in a range not departing from the gist of the invention.

Preferable aspects of the present invention will be supplementary described hereafter.

According to an aspect of the present invention, there is provided a method of manufacturing a semiconductor device, including:

forming an oxide film having a specific film thickness on a substrate by alternately repeating:

forming a specific element-containing layer on the substrate by supplying a source gas containing a specific element, to the substrate housed in a processing chamber and heated to a first temperature; and changing the specific element-containing layer formed on the substrate, to an oxide layer by supplying a reactive species containing oxygen to the substrate heated to the first temperature in the processing chamber under a pressure of less than atmospheric pressure, the reactive species being generated by causing a reaction between an oxygen-containing gas and a hydrogen-containing gas in a pre-reaction chamber under a pressure of less than atmospheric pressure and heated to a second temperature higher than the first temperature.

Preferably, in changing the specific element-containing layer to the oxide layer, each gas is supplied into the pre-reaction chamber under a condition that a flow rate of the hydrogen-containing gas is larger than a flow rate of the oxygen-containing gas.

Further preferably, in changing the specific element-containing layer to the oxide layer, supply of the hydrogen-containing gas is started before supply of the oxygen-containing gas is started, and supply of the hydrogen-containing gas is stopped after supply of the oxygen-containing gas is stopped.

Further preferably, when each sequence is alternately repeated, and in changing the specific element-containing layer to the oxide layer at an initial time of a film formation, each gas is supplied into the pre-reaction chamber under a condition that the flow rate of the hydrogen-containing gas is larger than a flow rate of the oxygen-containing gas, and in changing the specific element-containing layer to the oxide layer in a mid-point of the film formation, each gas is supplied into the pre-reaction chamber under a condition that the flow rate of the oxygen-containing gas is larger than the flow rate of the hydrogen-containing gas.

Further preferably, in changing the specific element-containing layer to the oxide layer, the hydrogen-containing gas is further directly supplied into the processing chamber not through the pre-reaction chamber.

Further preferably, in changing the specific element-containing layer to the oxide layer, a condition is set so that the flow rate of the hydrogen-containing gas is larger than the flow rate of the oxygen-containing gas in the processing chamber, by further directly supplying the hydrogen-containing gas into the processing chamber not through the pre-reaction chamber.

Further preferably, when each sequence is alternately repeated, and in changing the specific element-containing layer to the oxide layer at the initial time of the film formation, the hydrogen-containing gas is further directly supplied into the processing chamber not through the pre-reaction chamber, and in changing the specific element-containing layer to the oxide layer in the mid-point of the film formation, the directly supplying of the hydrogen-containing gas into the processing chamber is stopped.

Further preferably, when each sequence is alternately repeated, and in changing the specific element-containing layer to the oxide layer at the initial time of the film formation, a condition is set so that a flow rate of the hydrogen-containing gas is larger than a flow rate of the oxygen-containing gas in the processing chamber, by further directly supplying the hydrogen-containing gas into the processing chamber not through the pre-reaction chamber, and in changing the specific element-containing layer to the oxide layer in the mid-point of the film formation, a condition is set so that the flow rate of the oxygen-containing gas is larger than the flow rate of the hydrogen-containing gas in the processing chamber, by stopping the directly supplying of the hydrogen-containing gas into the processing chamber.

Further preferably, a metal film is formed on a surface of the substrate, and in forming the oxide film having the specific film thickness, the oxide film is formed on the metal film.

Further preferably, in changing the specific element-containing layer to the oxide layer, each gas is supplied into the pre-reaction chamber under a condition that the flow rate of the oxygen-containing gas is larger than the flow rate of the hydrogen-containing gas.

Further preferably, the method further includes: modifying the oxide film having the specific film thickness formed on the substrate, by supplying the reactive species containing oxygen to the substrate heated to the first temperature or heated to a third temperature higher than the first temperature and lower than the second temperature in the processing chamber under the pressure of less than atmospheric pressure, the reactive species being generated by causing a reaction between the oxygen-containing gas and the hydrogen-containing gas in the pre-reaction chamber under the pressure of less than atmospheric pressure and heated to the second temperature.

Further preferably, the first temperature is set to 100° C. or more and 600° C. or less, and the second temperature is set to 450° C. or more and 1200° C. or less.

Further preferably, the first temperature is set to 100° C. or more and 600° C. or less, and the second temperature is set to 600° C. or more and 1200° C. or less.

Further preferably, the first temperature is set to 100° C. or more and 400° C. or less, and the second temperature is set to 450° C. or more and 1200° C. or less.

Further preferably, the specific element is a metal element.

Further preferably, the specific element is the metal element, and the specific element-containing layer is a metal element-containing layer, and the oxide layer is a metal oxide layer, and the oxide film is a metal oxide film.

Further preferably, the specific element is a semiconductor element.

Further preferably, the specific element is a semiconductor element, and the specific element-containing layer is a semiconductor element-containing layer, and the oxide layer is a semiconductor oxide layer, and the oxide film is a semiconductor oxide film.

Further preferably, the specific element is silicon.

Further preferably, the specific element is silicon, and the specific element-containing layer is a silicon-containing layer, and the oxide layer is a silicon oxide layer, and the oxide film is a silicon oxide film.

Further preferably, the specific element-containing layer is a deposition layer of the specific element.

Further preferably, the specific element-containing layer is a layer formed by deposition of the specific element on the substrate.

Further preferably, the specific element-containing layer is an adsorption layer of the source gas.

Further preferably, the specific element-containing layer is a layer formed by adsorption of the source gas on the substrate.

Further preferably, the oxygen-containing gas is at least one of the gases selected from a group consisting of an oxygen gas, an ozone gas, a nitric monoxide gas, and a nitrous oxide gas, and the hydrogen-containing gas is at least one of the gases selected from a group consisting of a hydrogen gas, a heavy hydrogen gas, and an ammonia gas.

Further preferably, the oxygen-containing gas is an oxygen gas, and the hydrogen-containing gas is a hydrogen gas.

Further preferably, when the pressure in the pre-reaction chamber is maintained to a specific pressure, a hydrogen-containing gas is allowed to be supplied into, the pre-reaction chamber, and when the pressure in the pre-reaction chamber exceeds the specific pressure, the hydrogen-containing gas is not allowed to be supplied into the pre-reaction chamber.

Further preferably, when the pressure in the pre-reaction chamber is maintained to a specific pressure, the hydrogen-containing gas and the oxygen-containing gas are allowed to be supplied into the pre-reaction chamber, and when the pressure in the pre-reaction chamber exceeds the specific pressure, the hydrogen-containing gas and the oxygen-containing gas are not allowed to be supplied into the pre-reaction chamber.

Further preferably, the specific pressure is the pressure of 3999 Pa or less.

Further preferably, in changing the specific element-containing layer to the oxide layer, the pressure in the pre-reaction chamber is controlled to the pressure of 1 Pa or more and 3999 Pa or less.

According to other aspect of the present invention, there is provided a substrate processing method including:

forming an oxide film having a specific film thickness on a substrate by alternately repeating:

forming a specific element-containing layer on the substrate by supplying a source gas containing a specific element, to the substrate housed in a processing chamber and heated to a first temperature; and changing the specific element-containing layer formed on the substrate, to an oxide layer by supplying a reactive species containing oxygen to the substrate heated to the first temperature in the processing chamber under a pressure of less than atmospheric pressure, the reactive species being generated by causing a reaction between an oxygen-containing gas and a hydrogen-containing gas in a pre-reaction chamber under a pressure of less than atmospheric pressure and heated to a second temperature higher than the first temperature.

According to further other aspect of the present invention, there is provided a substrate processing apparatus, including:

a processing chamber configured to house a substrate and process the substrate;

a first heating source configured to heat the substrate to a first temperature in the processing chamber;

a pre-reaction chamber configured to cause a reaction among a plurality of kinds of gases;

a second heating source configured to heat an inside of the pre-reaction chamber to a second temperature;

a source gas supply system configured to supply a source gas containing a specific element into the processing chamber;

an oxygen-containing gas supply system configured to supply an oxygen-containing gas into the pre-reaction chamber;

a hydrogen-containing gas supply system configured to supply a hydrogen-containing gas into the pre-reaction chamber;

a piping part configured to connect the pre-reaction chamber and the processing chamber;

a pressure adjustment part configured to adjust pressures in the processing chamber and the pre-reaction chamber; and a control part configured to control the first heating source, the second heating source, the source gas supply system, the oxygen-containing gas supply system, the hydrogen-containing gas supply system, and the pressure adjustment part, so that an oxide film having a specific film thickness is formed on the substrate, by alternately repeating a process of forming a specific element-containing layer on the substrate by supplying the source gas to the substrate housed in the processing chamber and heated to the first temperature; and a process of changing the specific element-containing layer formed on the substrate, to an oxide layer by supplying a reactive species containing oxygen to the substrate heated to the first temperature in the processing chamber under a pressure of less than atmospheric pressure, the reactive species being generated by causing a reaction between the oxygen-containing gas and the hydrogen-containing gas in the pre-reaction chamber under a pressure of less than atmospheric pressure and heated to the second temperature higher than the first temperature.

According to further other aspect of the present invention, there is provided a program for making a computer execute:

a procedure of forming an oxide film having a specific film thickness on a substrate by alternately repeating:

a procedure of forming a specific element-containing layer on the substrate by supplying a source gas containing a specific element, to the substrate housed in a processing chamber and heated to a first temperature, in a substrate processing apparatus, and a procedure of changing the specific element-containing layer formed on the substrate, to an oxide layer by supplying a reactive species containing oxygen to the substrate heated to the first temperature in the processing chamber under a pressure of less than atmospheric pressure, the reactive species being generated by causing a reaction between an oxygen-containing gas and a hydrogen-containing gas in a pre-reaction chamber under a pressure of less than atmospheric pressure and heated to a second temperature higher than the first temperature.

According to further other aspect of the present invention, there is provided a computer readable recording medium, recording a program for making a computer execute:

a procedure of forming an oxide film having a specific film thickness on a substrate by alternately repeating:

a procedure of forming a specific element-containing layer on the substrate by supplying a source gas containing a specific element, to the substrate housed in a processing chamber and heated to a first temperature, in a substrate processing apparatus, and a procedure of changing the specific element-containing layer formed on the substrate, to an oxide layer by supplying a reactive species containing oxygen to the substrate heated to the first temperature in the processing chamber under a pressure of less than atmospheric pressure, the reactive species being generated by causing a reaction between an oxygen-containing gas and a hydrogen-containing gas in a pre-reaction chamber under a pressure of less than atmospheric pressure and heated to a second temperature higher than the first temperature.

DESCRIPTION OF SIGNS AND NUMERALS

200 Wafer
201 Processing chamber
202 Processing furnace
203 Process tube
207 First heater
231 Exhaust tube
232 Source gas supply tube
232a Oxygen-containing gas supply tube
232b Hydrogen-containing gas supply tube
232h Reaction gas supply tube
244 APC valve
245 Pressure sensor
245a Pressure sensor
245b Pressure sensor
246 Vacuum pump
263 Temperature sensor
263a Temperature sensor
280 Controller
300 Pre-reaction vessel
301 Pre-reaction chamber
302 Second heater

The invention claimed is:

1. A method of manufacturing a semiconductor device, comprising:
    forming an oxide film having a specific film thickness on a substrate by alternately repeating:
    forming a specific element-containing layer on the substrate by supplying a source gas containing a specific element, to the substrate housed in a processing chamber and heated to a first temperature; and
    changing the specific element-containing layer formed on the substrate, to an oxide layer by supplying a reactive species containing oxygen to the substrate heated to the first temperature in the processing chamber under a pressure of less than atmospheric pressure, the reactive species being generated by causing a reaction between an oxygen-containing gas and a hydrogen-containing gas in a pre-reaction chamber under a pressure of less than atmospheric pressure and heated to a second temperature higher than the first temperature.

2. The method of claim 1, wherein in changing the specific element-containing layer to the oxide layer, each gas is supplied into the pre-reaction chamber under a condition that a flow rate of the hydrogen-containing gas is larger than a flow rate of the oxygen-containing gas.

3. The method of claim 1, wherein in changing the specific element-containing layer to the oxide layer, supply of the hydrogen-containing gas is started before supply of the oxygen-containing gas is started, and supply of the hydrogen-containing gas is stopped after supply of the oxygen-containing gas is stopped.

4. The method of claim 1, wherein when each sequence is alternately repeated, and in changing the specific element-containing layer to the oxide layer at an initial time of a film formation, each gas is supplied into the pre-reaction chamber under a condition that a flow rate of the hydrogen-containing gas is larger than a flow rate of the oxygen-containing gas, and in changing the specific element-containing layer to the oxide layer in a mid-point of the film formation, each gas is supplied into the pre-reaction chamber under a condition that the flow rate of the oxygen-containing gas is larger than the flow rate of the hydrogen-containing gas.

5. The method of claim 1, wherein in changing the specific element-containing layer to the oxide layer, the hydrogen-containing gas is further directly supplied into the processing chamber not through the pre-reaction chamber.

6. The method of claim 1, wherein in changing the specific element-containing layer to the oxide layer, a condition is set so that a flow rate of the hydrogen-containing gas is larger than a flow rate of the oxygen-containing gas in the processing chamber, by further directly supplying the hydrogen-containing gas into the processing chamber not through the pre-reaction chamber.

7. The method of claim 1, wherein when each sequence is alternately repeated, and in changing the specific element-containing layer to the oxide layer at an initial time of a film formation, the hydrogen-containing gas is further directly supplied into the processing chamber not through the pre-reaction chamber, and in changing the specific element-containing layer to the oxide layer in a mid-point of the film formation, the directly supplying of the hydrogen-containing gas into the processing chamber is stopped.

8. The method of claim 1, wherein when each sequence is alternately repeated, and in changing the specific element-containing layer to the oxide layer at an initial time of a film formation, a condition is set so that a flow rate of the hydrogen-containing gas is larger than a flow rate of the oxygen-containing gas in the processing chamber, by further directly supplying the hydrogen-containing gas into the processing chamber not through the pre-reaction chamber, and in changing the specific element-containing layer to the oxide layer in a mid-point of the film formation, a condition is set so that the flow rate of the oxygen-containing gas is larger than the flow rate of the hydrogen-containing gas in the processing chamber, by stopping the directly supplying of the hydrogen-containing gas into the processing chamber.

9. The method of claim 1, wherein a metal film is formed on a surface of the substrate, and in forming the oxide film having the specific film thickness, the oxide film is formed on the metal film.

10. The method of claim 1, wherein in changing the specific element-containing layer to the oxide layer, each gas is supplied into the pre-reaction chamber under a condition that a flow rate of the oxygen-containing gas is larger than a flow rate of the hydrogen-containing gas.

11. The method of claim 1, further comprising: modifying the oxide film having the specific film thickness formed on the substrate, by supplying the reactive species containing oxygen to the substrate heated to the first temperature or heated to a third temperature higher than the first temperature and lower than the second temperature in the processing chamber under the pressure of less than atmospheric pressure, the reactive species being generated by causing a reaction between the oxygen-containing gas and the hydrogen-containing gas in the pre-reaction chamber under the pressure of less than atmospheric pressure and heated to the second temperature.

12. The method of claim 1, wherein the first temperature is set to 100° C. or more and 600° C. or less, and the second temperature is set to 450° C. or more and 1200° C. or less.

13. The method of claim 1, wherein the first temperature is set to 100° C. or more and 400° C. or less, and the second temperature is set to 450° C. or more and 1200° C. or less.

14. A substrate processing method comprising:
    forming an oxide film having a specific film thickness on a substrate by alternately repeating:

forming a specific element-containing layer on the substrate by supplying a source gas containing a specific element, to the substrate housed in a processing chamber and heated to a first temperature; and changing the specific element-containing layer formed on the substrate, to an oxide layer by supplying a reactive species containing oxygen to the substrate heated to the first temperature in the processing chamber under a pressure of less than atmospheric pressure, the reactive species being generated by causing a reaction between an oxygen-containing gas and a hydrogen-containing gas in a pre-reaction chamber under a pressure of less than atmospheric pressure and heated to a second temperature higher than the first temperature.

15. A substrate processing apparatus, comprising:
- a processing chamber configured to house a substrate and process the substrate;
- a first heating source configured to heat the substrate to a first temperature in the processing chamber;
- a pre-reaction chamber configured to cause a reaction among a plurality of kinds of gases;
- a second heating source configured to heat an inside of the pre-reaction chamber to a second temperature;
- a source gas supply system configured to supply a source gas containing a specific element into the processing chamber;
- an oxygen-containing gas supply system configured to supply an oxygen-containing gas into the pre-reaction chamber;
- a hydrogen-containing gas supply system configured to supply a hydrogen-containing gas into the pre-reaction chamber;
- a piping part configured to connect the pre-reaction chamber and the processing chamber;
- a pressure adjustment part configured to adjust pressures in the processing chamber and the pre-reaction chamber; and
- a control part configured to control the first heating source, the second heating source, the source gas supply system, the oxygen-containing gas supply system, the hydrogen-containing gas supply system, and the pressure adjustment part, so that an oxide film having a specific film thickness is formed on the substrate, by alternately repeating a process of forming a specific element-containing layer on the substrate by supplying the source gas to the substrate housed in the processing chamber and heated to the first temperature; and a process of changing the specific element-containing layer formed on the substrate, to an oxide layer by supplying a reactive species containing oxygen to the substrate heated to the first temperature in the processing chamber under a pressure of less than atmospheric pressure, the reactive species being generated by causing a reaction between an oxygen-containing gas and a hydrogen-containing gas in the pre-reaction chamber under a pressure of less than atmospheric pressure and heated to the second temperature higher than the first temperature.

* * * * *